US012567877B2

(12) United States Patent　(10) Patent No.:　US 12,567,877 B2
Park et al.　(45) Date of Patent:　Mar. 3, 2026

(54) ELECTRONIC DEVICE HAVING DIPLEXER OF STACKED STRUCTURE

(71) Applicant: Samsung Electronics Co., Ltd., Suwon-si (KR)

(72) Inventors: Jonghyun Park, Suwon-si (KR); Taeyoung Kim, Suwon-si (KR); Dongil Yang, Suwon-si (KR); Hyoseok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 289 days.

(21) Appl. No.: 18/185,063

(22) Filed: Mar. 16, 2023

(65) Prior Publication Data

US 2023/0216534 A1　Jul. 6, 2023

Related U.S. Application Data

(63) Continuation of application No. PCT/KR2021/012406, filed on Sep. 13, 2021.

(30) Foreign Application Priority Data

Sep. 17, 2020　(KR) ........................ 10-2020-0119839

(51) Int. Cl.
　*H04B 1/48*　(2006.01)
　*H03H 7/01*　(2006.01)
　*H04B 1/50*　(2006.01)
(52) U.S. Cl.
　CPC ............. *H04B 1/48* (2013.01); *H03H 7/0115* (2013.01); *H04B 1/50* (2013.01)

(58) Field of Classification Search
　CPC ........... H04B 1/48; H04B 1/50; H03H 7/0115
　　(Continued)

(56) References Cited

U.S. PATENT DOCUMENTS 6,928,298 B2 *　8/2005　Furutani ................ H04B 1/406
　　　　　　　　　　　　　　　　　455/553.1
7,149,496 B2　12/2006　Horiuchi et al.
　　(Continued)

FOREIGN PATENT DOCUMENTS

CN　　　102106083 A　6/2011
KR　10-2005-0012371 A　2/2005
　　(Continued)

OTHER PUBLICATIONS

Cheon et al. 3- to 5-GHz Ultra-Compact Bandpass Filter With Independent Transmission Zeros Using PCB Embedding Passive Technology, IEEE. (Year: 2012).*

(Continued)

*Primary Examiner* — Sam K Ahn
(74) *Attorney, Agent, or Firm* — Jefferson IP Law, LLP

(57) ABSTRACT

An electronic device is provided. The electronic device includes an antenna, a wireless communication circuit, and a diplexer. The diplexer includes a first port, and second and third ports connected to the wireless communication circuit, a low pass filter (LPF) configured to filter an RF signal of a low frequency band from a signal received from one of the first port and the second port and output same to the other one of the first port and the second port, and a high pass filter (HPF) configured to filter an RF signal of a high frequency band from a signal received from one of the first port and the third port and output same to the other one of the first port and the third port.

18 Claims, 15 Drawing Sheets

(58) Field of Classification Search
USPC .......................................................... 455/83
See application file for complete search history.

(56) References Cited

U.S. PATENT DOCUMENTS

| | | | |
|---|---|---|---|
| 8,391,821 B2 | 3/2013 | Okabe | |
| 9,331,835 B1 * | 5/2016 | Lee | H04B 1/0057 |
| 10,270,419 B2 | 4/2019 | Mizoguchi | |
| 2001/0027119 A1 | 10/2001 | Furutani et al. | |
| 2008/0318623 A1 | 12/2008 | Furutani et al. | |
| 2010/0157858 A1 | 6/2010 | Lee et al. | |
| 2011/0193650 A1 | 8/2011 | Takenoshita et al. | |
| 2013/0194054 A1 | 8/2013 | Presti | |
| 2014/0197902 A1 | 7/2014 | Zuo et al. | |
| 2017/0012599 A1 | 1/2017 | Iwanaga | |
| 2018/0083591 A1 | 3/2018 | Mandegaran | |
| 2019/0165755 A1 | 5/2019 | Tsai | |
| 2020/0403597 A1 * | 12/2020 | Takeuchi | H03H 7/463 |

FOREIGN PATENT DOCUMENTS

| | | | |
|---|---|---|---|
| KR | 10-0681259 B1 | 2/2007 | |
| KR | 10-0862886 B1 | 10/2008 | |
| KR | 20-2009-0003799 U | 4/2009 | |
| KR | 10-2011-0120668 A | 11/2011 | |
| KR | 10-1482955 B1 | 1/2015 | |
| KR | 10-2016-0129062 A | 11/2016 | |
| KR | 20-0487012 Y1 | 7/2018 | |
| RU | 2 533 691 C1 | 11/2014 | |

OTHER PUBLICATIONS

Vern Solberg Embedding Passive and Active Components: PCB Design and Fabrication Process Variations, Solberg Technical Consulting. (Year: 2015).*

European Office Action dated Feb. 19, 2024, issued in European Application No. 21869650.8.

International Search Report dated Dec. 24, 2021, issued in International Application No. PCT/KR2021/012406.

Korean Office Action dated Sep. 9, 2024, issued in Korean Application No. 10-2020-0119839.

Chinese Office Action with English translation dated Aug. 5, 2025; Chinese Appln. No. 202180063752.0.

* cited by examiner

FIG. 2

ELECTRONIC DEVICE HAVING DIPLEXER OF STACKED STRUCTURE

CROSS-REFERENCE TO RELATED APPLICATION(S)

This application is a continuation application, claiming priority under § 365(c), of an International application No. PCT/KR2021/012406, filed on Sep. 13, 2021, which is based on and claims the benefit of a Korean patent application number 10-2020-0119839, filed on Sep. 17, 2020, in the Korean Intellectual Property Office, the disclosure of which is incorporated by reference herein in its entirety.

BACKGROUND

1. Field

The disclosure relates to an electronic device configured to transmit and receive a radio frequency (RF) signal in a multi-frequency band via a single antenna by using a diplexer.

2. Description of Related Art

A diplexer may be configured to separate an RF signal received from an antenna into an RF signal of a first frequency band and an RF signal of a second frequency band and to output the RF signals to a wireless communication circuit (e.g., a transceiver) via different signal paths, and may be configured to output an RF signal received from the wireless communication circuit to an antenna.

The above information is presented as background information only to assist with an understanding of the disclosure. No determination has been made, and no assertion is made, as to whether any of the above might be applicable as prior art with regard to the disclosure.

SUMMARY

A diplexer may be disposed on one side of a board. For example, an outer mounted component (e.g., a lumped element), as a diplexer, may be disposed on a printed circuit board (PCB) surface according to surface mounter technology. Since the diplexer is embodied as an outer mounted component, the material cost may be increased. The diplexer is disposed on one side of the board, and may occupy a part of an inner space of the electronic device. Therefore, it may be difficult to secure an internal space of the electronic device (e.g., a smartphone) in which component elements are to be disposed. In the case that a diplexer is disposed on one side of the board included in the electronic device, the diplexer may be destroyed or separated from the board when external impact affects thereon or when assembling is performed.

Aspects of the disclosure are to address at least the above-mentioned problems and/or disadvantages and to provide at least the advantages described below. Accordingly, an aspect of the disclosure is to provide an electronic device that reduces an internal space for a diplexer and includes a diplexer embodied with a relatively low material cost.

Additional aspects will be set forth in part in the description which follows and, in part, will be apparent from the description, or may be learned by practice of the presented embodiments.

In accordance with an aspect of the disclosure, an electronic device is provided. The electronic device includes an antenna, a wireless communication circuit, and a diplexer connected to the antenna and the wireless communication circuit, wherein the diplexer includes a first port connected to the antenna, a second port connected to the wireless communication circuit, a third port connected to the wireless communication circuit, a low pass filter (LPF) configured to filter a signal received from one of the first port and the second port so as to obtain an RF signal of a low-frequency band and to output the RF signal of the low-frequency band to the other port between the first port and the second port, and a high pass filter (HPF) configured to filter a signal received from one of the first port and the third port so as to obtain an RF signal of a high-frequency band and to output the RF signal of the high-frequency band to the other port between the first port and the third port, wherein the LPF includes a capacitor disposed on a surface of a printed circuit board (PCB) and an inductor formed in a pattern on the PCB, and wherein the HPF includes an inductor disposed on the surface of the PCB and a capacitor formed in a pattern on the PCB.

According to various embodiments, there may be provided a diplexer that is inexpensive and easy to dispose in an electronic device. The electronic device may transmit or receive RF signals in multi-frequency band via a single antenna by using such a diplexer. In addition, various effects directly or indirectly recognized from the document may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a block diagram of an electronic device configured to transmit and receive an RF signal in a multi-frequency band via a single antenna according to an embodiment of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
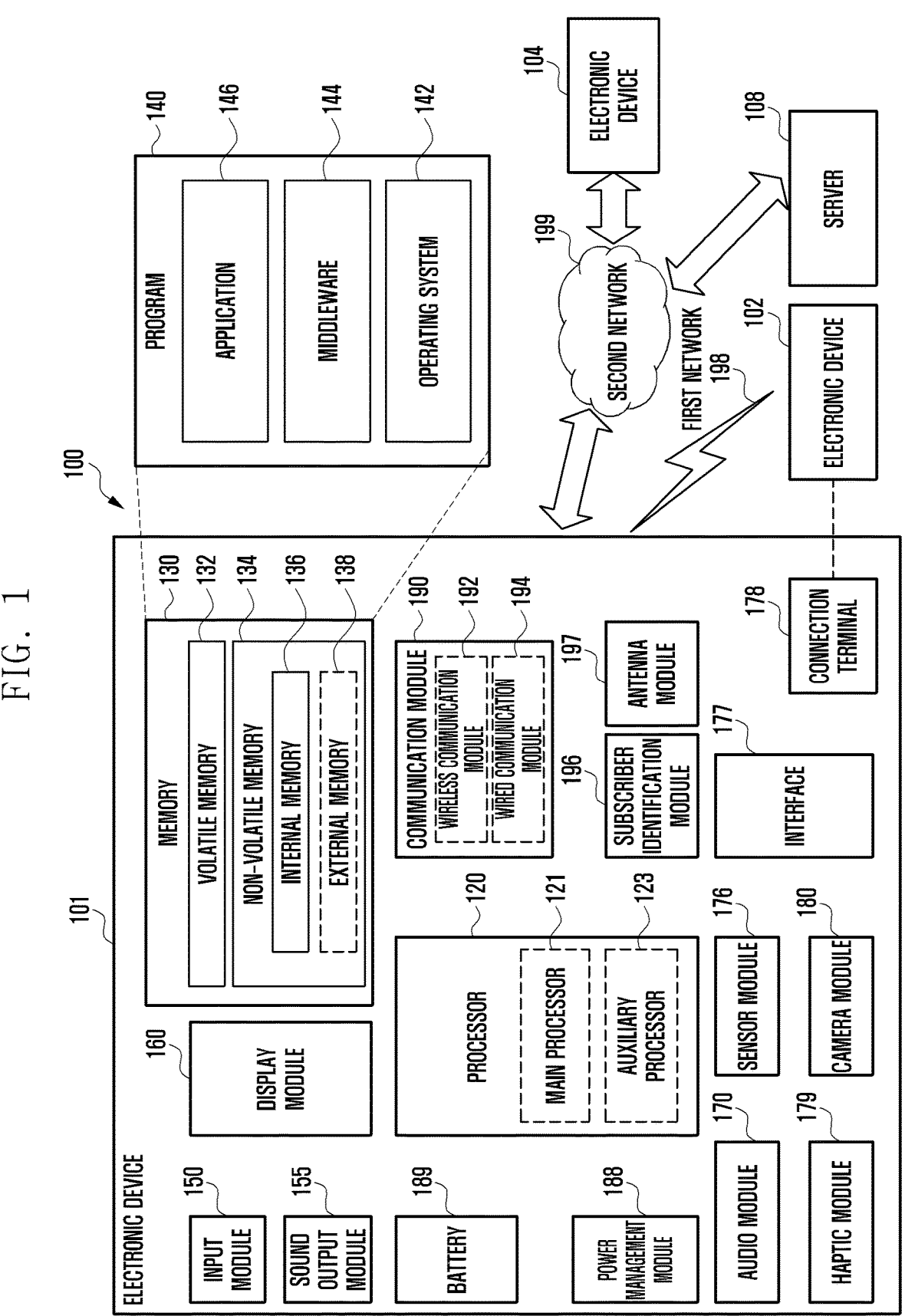
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mm Wave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
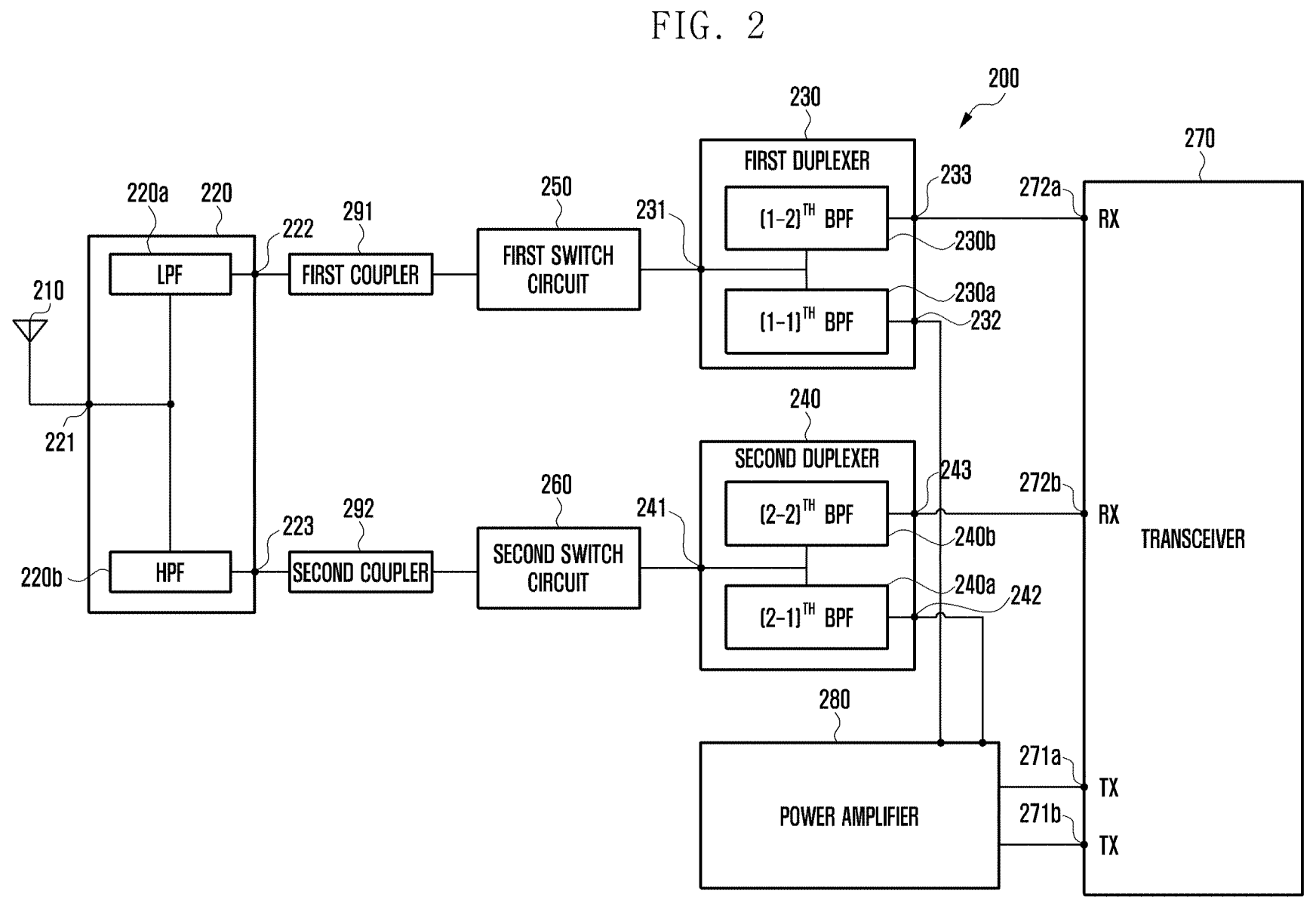

FIG. 2 is a block diagram of an electronic device 200 configured to transmit and receive an RF signal in a multi-frequency band via a single antenna according to an embodiment of the disclosure.

Referring to FIG. 2, the electronic device 200 (e.g., the electronic device 101 of FIG. 1) may include an antenna 210, a diplexer 220, a first duplexer 230, a second duplexer 240, a first switch circuit 250, a second switch circuit 260, and/or a transceiver 270.

The diplexer 220 may include a low pass filter (LPF) 220a and a high pass filter (HPF) 220b. The LPF 220a may filter an input RF signal so as to extract and output an RF signal having a low-frequency band (e.g., approximately 3 GHz or lower). The HPF 220b may filter an input RF signal so as to extract and output an RF signal having a high-frequency band (e.g., approximately 3 GHz or higher). The diplexer 220 may include a first port 221 connected to the antenna 210, a second port 222 connected to a first coupler 291, and a third port 223 connected to a second coupler 292. The LPF 220a may be configured to filter a signal received via one of the first port 221 and the second port 222 so as to extract an RF signal having a low-frequency band, and to output the same to the other port between the first port 221 and the second port 222. The HPF 220b may be configured to filter a signal received via one of the first port 221 and the third port 223 so as to extract an RF signal having a high-frequency band, and to output the same to the other port between the first port 221 and the third port 223.

The first duplexer 230 may include a $(1\text{-}1)^{th}$ band pass filter (BPF) 230a configured to output an RF signal of a first transmission frequency band designated to be used for data transmission to a network (e.g., the first network 198 of FIG. 1), a $(1\text{-}2)^{th}$ BPF 230b configured to output an RF signal of a first reception frequency band designated to be used for data reception from a network, a $(1\text{-}1)^{th}$ port 231 connected to the $(1\text{-}1)^{th}$ BPF 230a and the $(1\text{-}2)^{th}$ BPF 230b and connected to the first switch circuit 250, a $(1\text{-}2)^{th}$ port 232 connected to a first transmission port 271a of the transceiver 270 via a power amplifier 280, and a $(1\text{-}3)^{th}$ port 233 connected to a first reception port 272a of the transceiver 270. The $(1\text{-}1)^{th}$ BPF 230a may be configured to filter a signal received from the first transmission port 271a of the transceiver 270 via the $(1\text{-}2)^{th}$ port 232 so as to extract an RF signal having a first transmission frequency band, and may output the same to the $(1\text{-}1)^{th}$ port 231. The $(1\text{-}2)^{th}$ BPF 230b may be configured to filter a signal received via the $(1\text{-}1)^{th}$ port 231 so as to extract an RF signal having a first reception frequency band, and to output the same to the first reception port 272a of the transceiver 270 via the $(1\text{-}3)^{th}$ port 233.

The second duplexer 240 may include a $(2\text{-}1)^{th}$ BPF 240a configured to output an RF signal of a second transmission frequency band designated to be used for data transmission to a network (e.g., the first network 198 of FIG. 1), a $(2\text{-}2)^{th}$ BPF 240b configured to output an RF signal of a second reception frequency band designated to be used for data reception from a network, a $(2\text{-}1)^{th}$ port 241 connected to the $(2\text{-}1)^{th}$ BPF 240a and the $(2\text{-}2)^{th}$ BPF 240b and connected to the second switch circuit 260, a $(2\text{-}2)^{th}$ port 242 connected to a second transmission port 271b of the transceiver 270 via the power amplifier 280, and a $(2\text{-}3)^{th}$ port 243 connected to a second reception port 272b of the transceiver 270. The $(2\text{-}1)^{th}$ BPF 240a may be configured to filter a signal received from the second transmission port 271b of the transceiver 270 via the $(2\text{-}2)^{th}$ port 242 so as to extract an RF signal having a second transmission frequency band, and may output the RF signal to the $(2\text{-}1)^{th}$ port 241. The $(2\text{-}2)^{th}$ BPF 240b may be configured to filter a signal received via the $(2\text{-}1)^{th}$ port 241 so as to extract an RF signal having a second reception frequency band, and to output the RF signal to the second reception port 272b of the transceiver 270 via the $(2\text{-}3)^{th}$ port 243.

According to various embodiments of the disclosure, a transmission frequency band may include an uplink band in one of the frequency bands designated to be used for a frequency division duplexing (FDD) communication scheme in a 5G or legacy network (e.g., the second network 199 of FIG. 1) defined by third generation partnership project (3GPP). A reception frequency band may include a downlink band in the frequency band. The uplink band may be lower or higher than the downlink band. For example, the legacy network may include a $2^{nd}$ generation (2G), 3G, 4G, or long term evolution (LTE) network. According to various embodiments of the disclosure, BPFs 230a, 230b, 240a, and 240b may include surface acoustic wave (SAW) filters.

The first switch circuit (or a front end circuit) 250 may be disposed in a transmission line that connects the second port 222 of the diplexer 220 and the $(1\text{-}1)^{th}$ port 231 of the first duplexer 230. The first switch circuit 250 may output, to the first duplexer 230, an RF signal received from the antenna 210 via the diplexer 220. The first switch circuit 250 may output, to the diplexer 220, an RF signal received from the transceiver 270 via the first duplexer 230.

The second switch circuit 260 may be disposed in a transmission line that connects the third port 223 of the diplexer 220 and the $(2\text{-}1)^{th}$ port 241 of the second duplexer 240. The second switch circuit 260 may preprocess an RF signal received from the antenna 210 via the diplexer 220 and may output the same to the transceiver 270 via the second duplexer 240. The second switch circuit 260 may preprocess an RF signal received from the transceiver 270 via the second duplexer 240 and may output the same to the antenna 210 via the diplexer 220.

According to various embodiments of the disclosure, the electronic device 200 may further include a first amplification circuit and/or a second amplification circuit. The first amplification circuit (e.g., a low noise amplifier or a variable gain amplifier) may amplify an RF signal received from the antenna 210 via the $(1\text{-}2)^{th}$ BPF 230$b$ and may output the same to the transceiver 270 via the first reception port 272$a$. The second amplification circuit (e.g., a low noise amplifier or a variable gain amplifier) may amplify an RF signal received from the antenna 210 via the $(2\text{-}2)^{th}$ BPF 240$b$ and may output the same to the transceiver 270 via the second reception port 272$b$.

According to various embodiments of the disclosure, the transceiver 270 may be an element (e.g., a wireless communication circuit that supports communication with a cellular network) included in the wireless communication module 192. In the case of a transmission mode, the transceiver 270 may convert a baseband signal received from a processor into an RF signal and may output the RF signal to the antenna 210 via the first transmission port 271$a$ or the second transmission port 271$b$. In the case of a reception mode, the transceiver 270 may convert an RF signal received from the antenna 210 via the first reception port 272$a$ or the second reception port 272$b$ into a baseband signal and may output the same to a processor.

The electronic device 200 may further include the power amplifier 280, the first coupler 291 and/or the second coupler 292. The power amplifier 280 may amplify power of an RF signal received from the first transmission port 271$a$ of the transceiver 270 and may output the RF signal to the $(1\text{-}2)^{th}$ port 232 of the first duplexer 230. The power amplifier 280 may amplify power of an RF signal received from the second transmission port 271$b$ of the transceiver 270 and may output the same to the $(2\text{-}2)^{th}$ port 242 of the second duplexer 240. The first coupler 291 may be disposed in a transmission line that connects the second port 222 of the diplexer 220 and the first switch circuit 250, may obtain power of an RF signal output from the transceiver 270 to the antenna 210, and may output the same to the transceiver 270. The second coupler 292 may be disposed in a transmission line that connects the third port 223 of the diplexer 220 and the second switch circuit 260, may obtain power of an RF signal output from the transceiver 270 to the antenna 210, and may output the same to the transceiver 270.

Figure 3A:
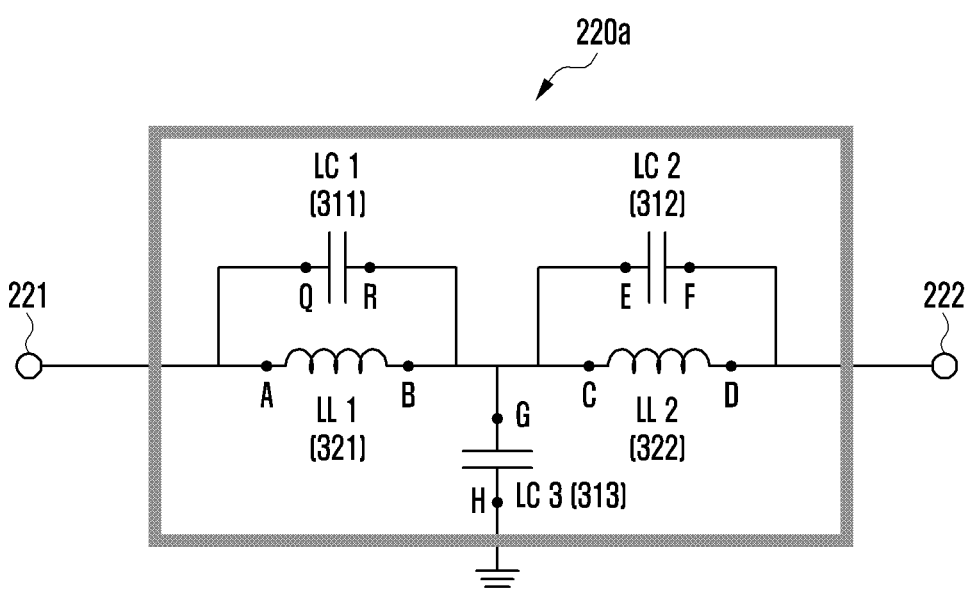
FIG. 3A is a circuit diagram of an LPF of FIG. 2 according to an embodiment of the disclosure.
Figure 3B:
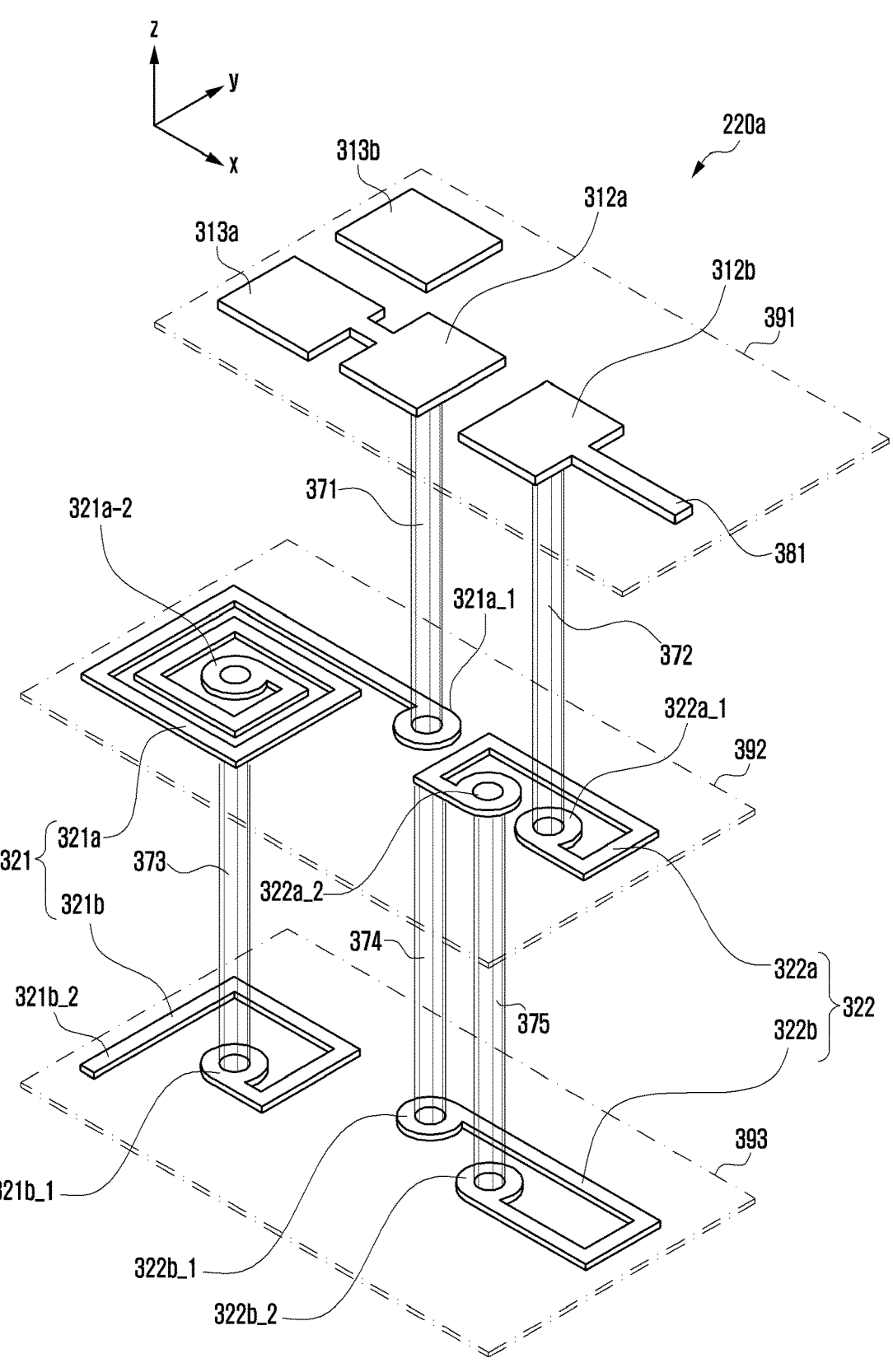
FIGS. 3B and 3C are diagrams illustrating layer structures of an LPF according to various embodiments of the disclosure.
Figure 3C:
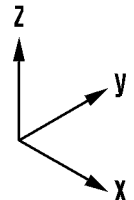
Figure 3C:
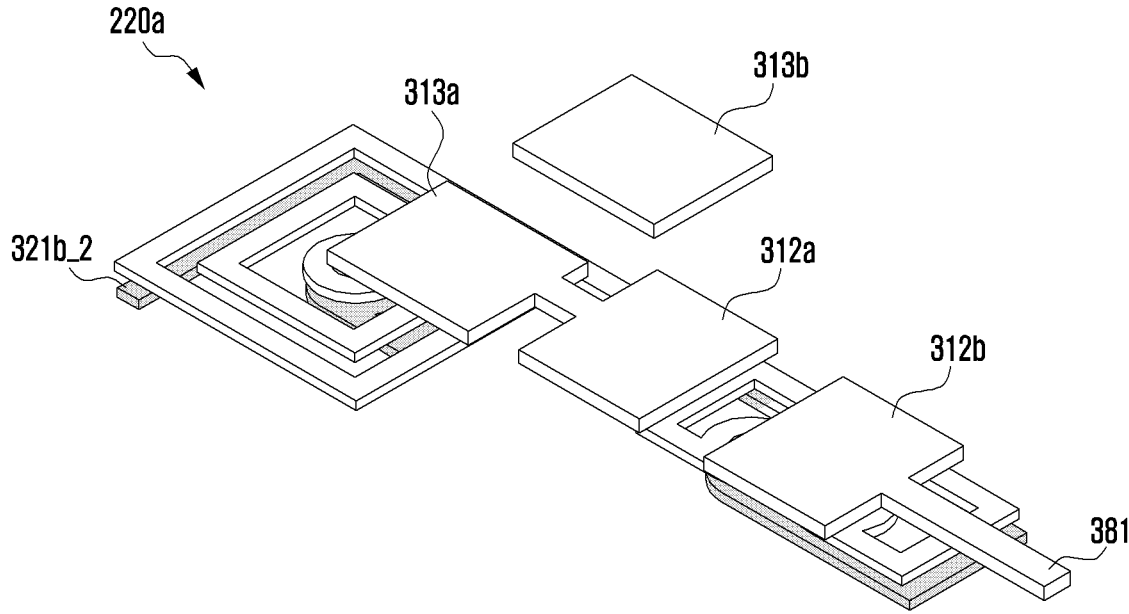
Figure 3D:
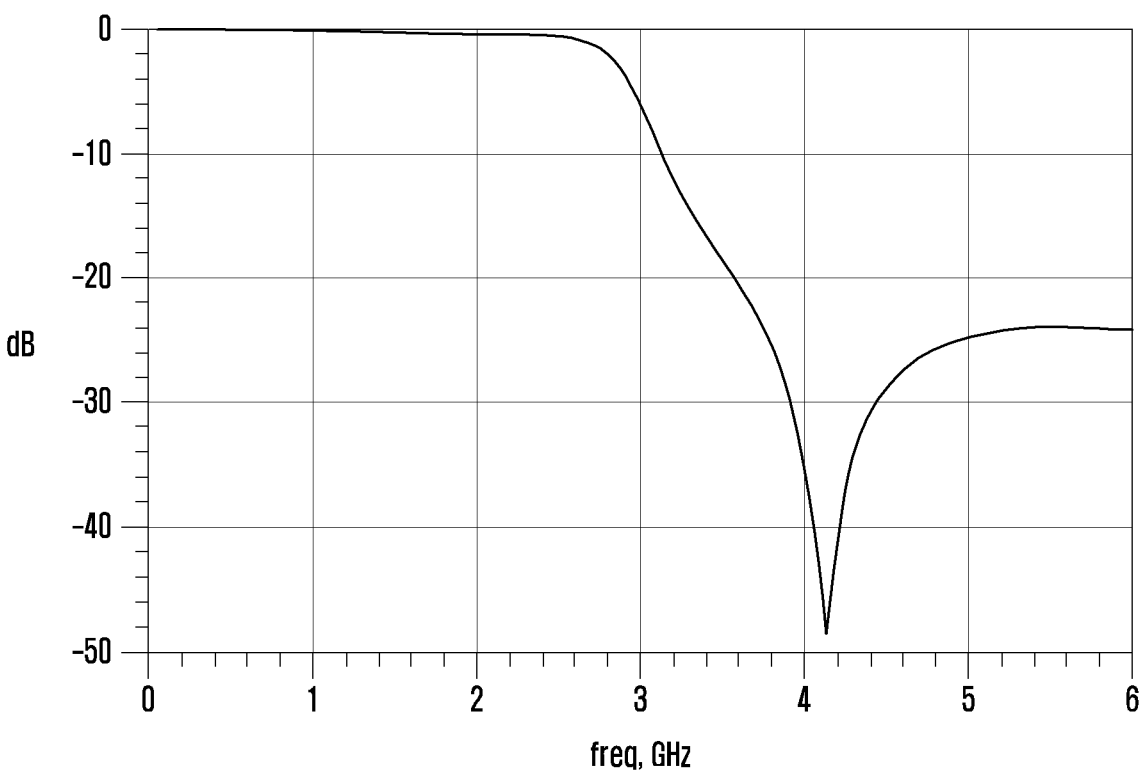
FIG. 3D is a graph illustrating a filtering performance of an LPF according to embodiments of the disclosure.

FIG. 3A is a circuit diagram of the LPF 220$a$ of FIG. 2 according to an embodiment of the disclosure, FIGS. 3B and 3C are diagrams illustrating layer structures of the LPF 220$a$ according to various embodiments of the disclosure, and FIG. 3D is a graph illustrating a filtering performance of the LPF 220$a$ according to an embodiment of the disclosure.

Referring to FIG. 3A, the LPF 220$a$ may include a first capacitor (LPF capacitor (LC)1) 311, a second capacitor (LC2) 312, a third capacitor (LC3) 313, a first inductor (LPF inductor (LL)1) 321, and/or a second inductor (LL2) 322.

One end (A) of the LL1 321 may be connected to the first port 221, and the other end (B) of the LL1 321 may be connected to one end (C) of the LL2 322. The other end (D)

of the LL2 322 may be connected to the second port 222. One end (Q) of the LC1 311 may be connected to the one end (A) of the LL1 321, and the other end (R) of the LC1 311 may be connected to the other end (B) of the LL1 321. One end (E) of the LC2 312 may be connected to the one end (C) of the LL2 322, and the other end (F) of the LC2 312 may be connected to the other end (D) of the LL2 322. One end (G) of the LC3 313 may be connected between the other end (B) of the LL1 321 and the one end (C) of the LL2 322. The other end (H) of the LC3 313 may be connected to a ground formed on a PCB. According to an embodiment of the disclosure, the LC1 311 is embodied as a parasitic capacitance between both ends of the LL1 321 and may be omitted in the circuit configuration of FIGS. 3A to 3D.

In the circuit configuration as shown in FIG. 3A, the combination of the LL1 321, the LL2 322, and the LC3 313 may operate as a filter that allows an RF signal of a low-frequency band to pass, and the combination of the LL1 321 and the LC1 311 and the combination of the LL2 322 and the LC2 322 may operate as filters that block an RF signal of a high-frequency band from passing.

According to various embodiments of the disclosure, the LL1 321 and the LL2 322 may be formed (e.g., embedded) in a pattern on the PCB, and the LC2 312 and the LC3 313 may be lumped elements disposed on a surface of the PCB.

Referring to FIGS. 3B and 3C, the PCB may include a first layer 391, a second layer 392, and a third layer 393.

The first layer 391 may include a PCB surface on which a lumped element is to be disposed. For example, a $(1\text{-}1)^{th}$ pad 312$a$, a $(1\text{-}2)^{th}$ pad 312$b$, a $(2\text{-}1)^{th}$ pad 313$a$, and/or a $(2\text{-}2)^{th}$ pad 313$b$ may be formed in the first layer 391. The one end (E) of the LC2 312 is attached to the $(1\text{-}1)^{th}$ pad 312$a$, and the other end (F) of the LC2 312 may be attached to the $(1\text{-}2)^{th}$ pad 312$b$ separate from the $(1\text{-}1)^{th}$ pad 312$b$. The $(1\text{-}2)^{th}$ pad 312$b$ may be connected to the second port 222. For example, although not illustrated, a first contact point 381 that extends from the $(1\text{-}2)^{th}$ pad 312$b$ may be connected to the second port 222. The first contact point 381 may be the other end (D) of the LL2 322. The $(2\text{-}1)^{th}$ pad 313$a$ may be connected to the $(1\text{-}1)^{th}$ pad 312$a$, and the one end (G) of the LC3 313 may be attached to the $(2\text{-}1)^{th}$ pad 313$a$. The $(2\text{-}2)^{th}$ pad 313$b$ separate from the $(2\text{-}1)^{th}$ pad 313$a$ may be connected to a ground, and the other end (H) of the LC3 313 may be attached to the $(2\text{-}2)^{th}$ pad 313$b$ and may be connected to the ground. According to an embodiment of the disclosure, the $(1\text{-}1)^{th}$ pad 312$a$, the $(1\text{-}2)^{th}$ pad 312$b$, the $(2\text{-}1)^{th}$ pad 313$a$, and/or the $(2\text{-}2)^{th}$ pad 313$b$ may be provided in the form of a conductive patch.

A first part 321$a$ of the LL1 321 and a first part 322$a$ of the LL2 322 may be formed in the second layer 392. One end 321$a$_1 of the first part 321$a$ of the LL1 321 may be connected to the $(1\text{-}1)^{th}$ pad 312$a$ using a first via 371. The one end 321$a$_1 of the first part 321$a$ of the LL1 321 may be the other end (B) of the LL1 321. The first part 322$a$ of the LL2 322 may be disposed to be spaced apart from the first part 321$a$ of the LL1 321, and one end 322$a$_1 of the first part 322$a$ of the LL2 322 may be connected to the $(1\text{-}2)^{th}$ pad 312$b$ using a second via 372. The one end 321$a$_1 of the first part 322$a$ of the LL2 322 may be the other end (D) of the LL2 322.

According to an embodiment of the disclosure, the first part 321$a$ of the LL1 321 may include a conductive line in the form of a coil that extends from the other end 321$a$_2 of the first part 321$a$ of the LL1 321 to the one end 321$a$_1 of the first part 321$a$ of the LL1 321. According to another embodiment of the disclosure, the first part 322$a$ of the LL2 322 may extend from one end 322$a$_1 of the first part 322$a$ of the LL2 322 to the other end 322$a$_2 of the first part 322$a$ of the LL1 322, and may be provided in the form a conductive line having a curve.

The second part 321$b$ of the LL1 321 and the second part 322$b$ of the LL2 322 may be formed in the third layer 393. The one end 321$b$_1 of the second part 321$b$ of the LL1 321 may be connected to the other end 321$a$_2 of the first part 321$a$ of the LL1 321 using a third via 373. The other end 321$b$_2 of the second part 321$b$ of the LL1 321 may be connected to the first port 221. The other end 321$b$_2 of the second part 321$b$ of the LL1 321 may be one end (A) of the LL1 321. The one end 322$b$_1 of the second part 322$b$ of the LL2 322 may be connected to the one end 321$a$_1 of the first part 321$a$ of the LL1 321 using a fourth via 374. The other end 322$b$_2 of the second part 322$b$ of the LL2 322 may be connected to the one end 322$a$_2 of the first part 322$a$ of the LL2 322 using a fifth via 375.

According to an embodiment of the disclosure, the second part 321$b$ of the LL1 321 may extend from the one end 321$b$_1 of the second part 321$b$ of the LL1 321 to the other end 321$b$_2 of the second part 321$b$ of the LL1 321, and may be provided in the form of a conductive line having a curve. According to another embodiment, the second part 322$b$ of the LL2 322 may extend from the one end 322$b$_1 of the second part 322$b$ of the LL2 322 to the other end 322$b$_2 of the second part 322$b$ of the LL2 322, and may be provided in the form of a conductive line having a curve.

According to an embodiment of the disclosure, when viewed in the z-axis direction, at least a part of the first part 321$a$ of the LL1 321, the second part 321$b$ of the LL1 321, and the $(2$-$1)^{th}$ pad 313$a$ may overlap. According to another embodiment, at least a part of the first part 322$a$ of the LL2 322, the second part 322$b$ of the LL2 322, and the $(1$-$2)^{th}$ pad 312$b$ may overlap when viewed in the z-axis direction.

Referring to FIG. 3D, when an RF signal is input to one of the first port 221 and the second port 222, an RF signal of approximately 3 GHz or lower (e.g., long term evolution (LTE) band) may be output to the other port via the LPF 220$a$ without any loss. An RF signal of approximately 3 GHz or more (e.g., new radio (NR) frequency band 77 (N77), N79, N79) may not substantially pass through the LPF 220$a$. For example, a cutoff frequency of the LPF 220$a$ may be 3 GHz and a cutoff frequency band may be approximately 3 GHz or higher. According to an embodiment of the disclosure, a cutoff frequency may be changed when capacitance of a capacitor (e.g., the LC1 311, the LC2 312, LC3 313) and/or inductance of an inductor (e.g., the LL1 321, the LL2 322) is changed.

Figure 4A:
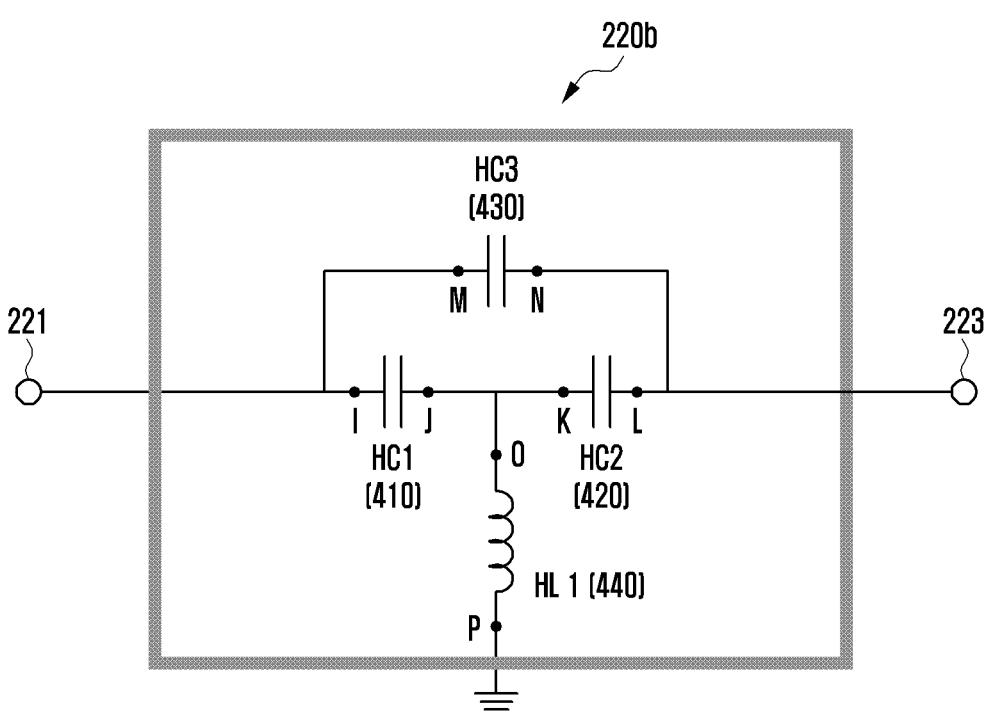
FIG. 4A is a circuit diagram of an HPF of FIG. 2 according to an embodiment of the disclosure.
Figure 4B:
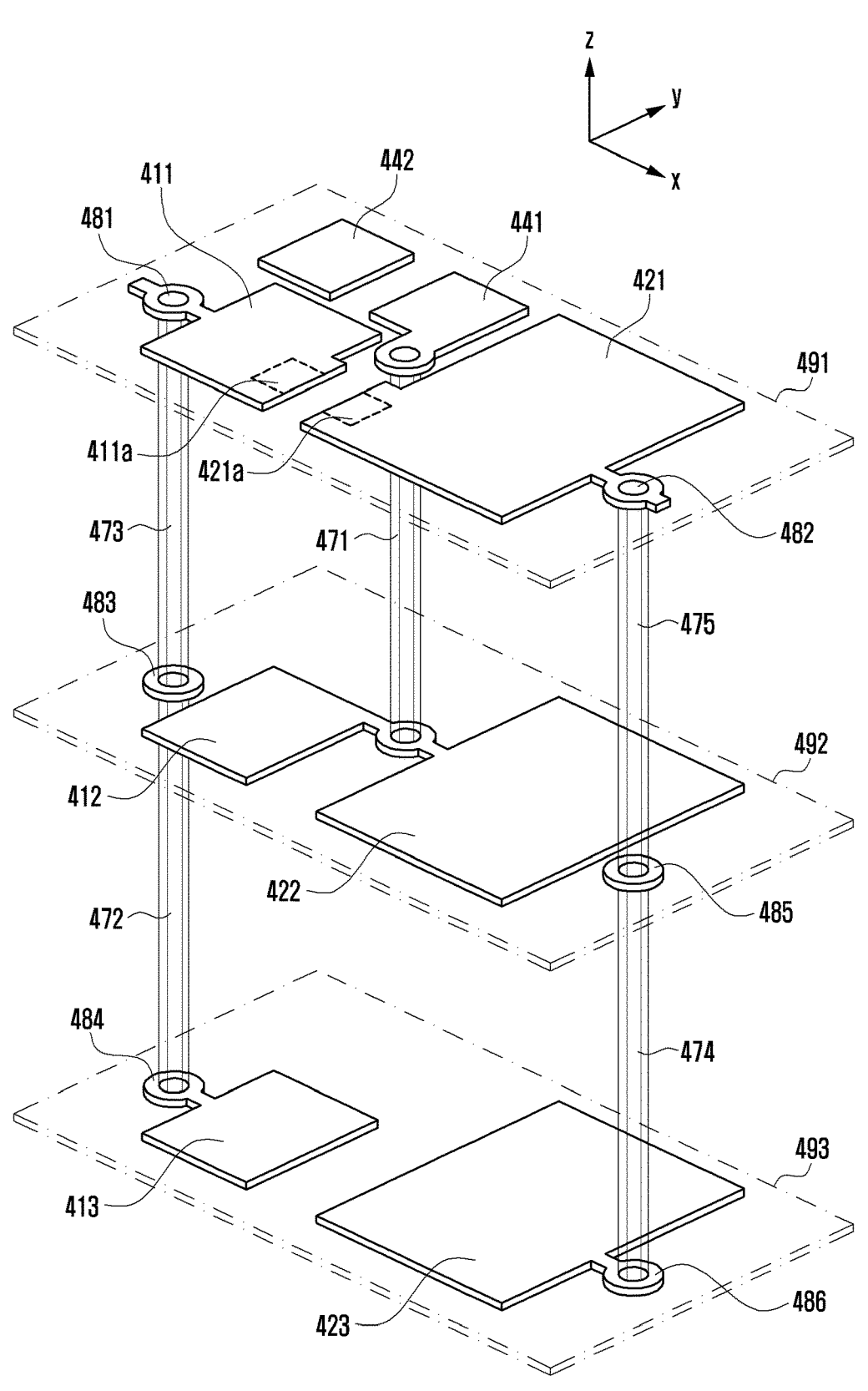
FIGS. 4B and 4C are diagrams illustrating layer structures of an HPF according to various embodiments of the disclosure.
Figure 4C:
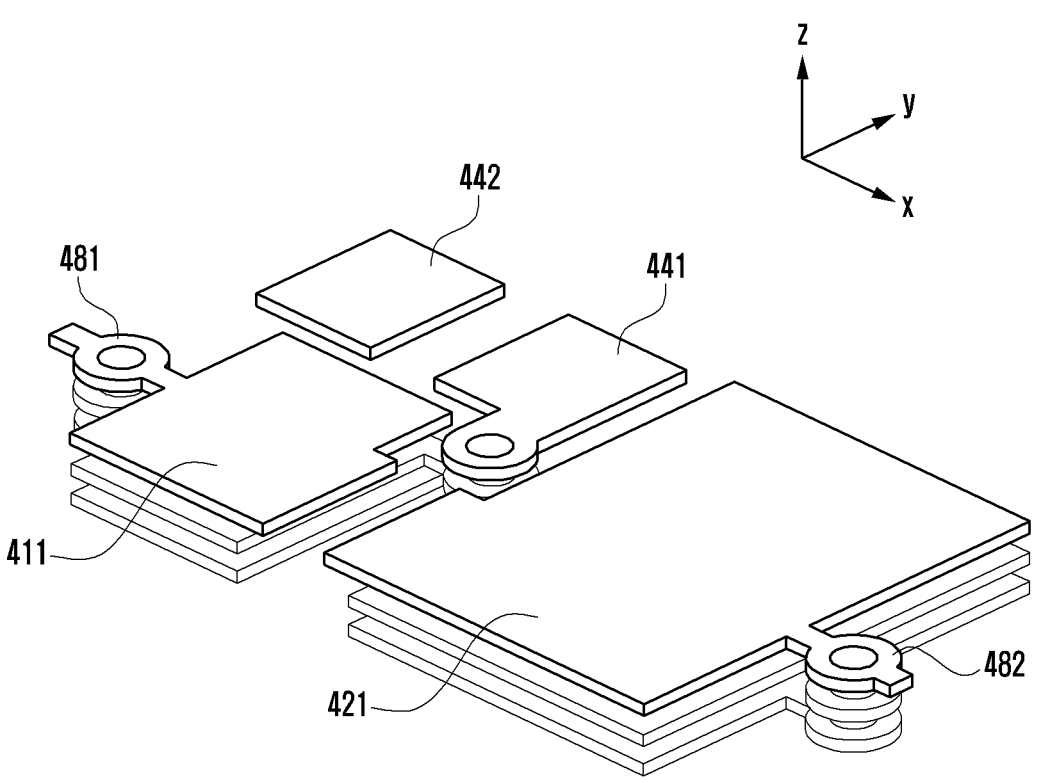
Figure 4D:
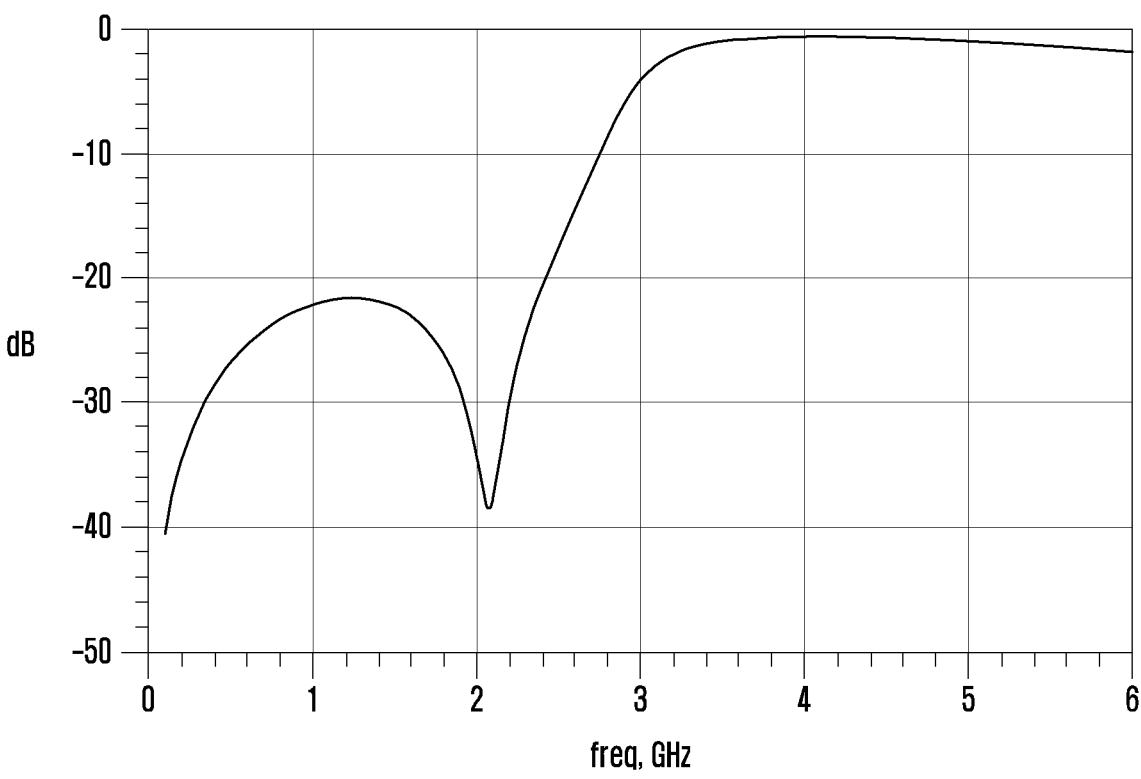
FIG. 4D is a graph illustrating a filtering performance of an HPF according to embodiments of the disclosure.

FIG. 4A is a circuit diagram of the HPF 220$b$ of FIG. 2 according to an embodiment of the disclosure, FIGS. 4B and 4C are diagrams illustrating layer structures of the HPF 220$b$ according to various embodiments of the disclosure, and FIG. 4D is a graph illustrating a filtering performance of the HPF 220$b$ according to an embodiment of the disclosure.

Referring to FIG. 4A, the HPF 220$b$ may include a first capacitor (HPF capacitor (HC)1) 410, a second capacitor (HC2) 420, a third capacitor (HC3) 430, and an inductor (HL1) 440.

One end (I) of the HC1 410 may be connected to the first port 221, and the other end (J) of the HC1 410 may be connected to one end (K) of the HC2 420. The other end (L) of the HC2 420 may be connected to the third port 223. One end (M) of the HC3 430 may be connected to the one end (I) of the HC1 410, and the other end (N) of the HC3 430 may be connected to the other end (L) of the HC2 420. One end (O) of the HL1 440 may be connected between the other end (J) of the HC1 410 and the one end (K) of the HC2 420. The other end (P) of the HL1 440 may be connected to a ground formed on a PCB.

In the circuit configuration as illustrated in FIG. 4A, the combination of the HC1 410, the HC2 420, and the HL1 440 may operate as a filter that allows an RF signal of a high-frequency band of a received signal to pass, and the HC3 430 may operate as a filter that blocks an RF signal of a low-frequency band from passing.

According to various embodiments of the disclosure, the HC1 410 and the HC2 420 may be formed in a pattern on the PCB, and the HC3 430 and the HL1 440 may be lumped elements disposed on the surface of the PCB.

Referring to FIGS. 4B and 4C, the PCB may include a first layer 491, a second layer 492, and a third layer 493. The first layer 491 may be the same layer as the first layer 391 of FIG. 3B. The second layer 492 may be the same layer as or a different layer from the second layer 392 of FIG. 3B. The third layer 493 may be a layer that is the same as or different from the third layer 393 of FIG. 3B.

A first pad 441, a second pad 442, and a first part 411 of the HC1 410, and a first part 421 of the HC2 420 may be formed in the first layer 491. One end (O) of the HL1 440 may be attached to the first pad 441, and the other end (P) of the HL1 440 may be attached to the second pad 442 separate from the first pad 441. The second pad 442 may be connected to a ground. One end (M) of the HC3 430 may be attached to the first part 411 of the HC1 410, and the other end (N) of the HC3 430 may be attached to the first part 421 of the HC2 420. Two neighboring edges 411$a$ and 421$a$ of the first part 411 of the HC1 410 and the first part 421 of the HC2 420 may be used as a pad to which the HC3 430 is to be attached. The first part 411 of the HC1 410 may be connected to the first port 221. A second contact point 481 (I) that extends from the first part 411 may be connected to the first port 221. The first part 421 of the HC2 420 may be connected to the third port 223. A third contact point 482 (L) that extends from the first part 421 may be connected to the third port 223.

A second part 412 of the HC1 410 and a second part 422 of the HC2 420 may be formed in the second layer 492. The second part 412 of the HC1 410 and the second part 422 of the HC2 420 may be connected to each other, and may be connected to the first pad 441 using a sixth via 471. According to an embodiment of the disclosure, at least a part of the first part 411 of the HC1 410 may overlap the second part 412 of the HC1 410 when viewed in the z-axis direction. According to another embodiment, at least a part of the first part 421 of the HC2 420 may overlap the second part 422 of the HC2 420 when viewed in the z-axis direction.

A third part 413 of the HC1 410 and a third part 423 of the HC2 420 separate therefrom may be formed in the third layer 493. The third part 413 of the HC1 410 may be connected to the first part 411. For example, a fourth contact point 483 separate from the second part 412 of the HC1 410 may be formed in the second layer 492. A fifth contact point 484 that extends from the third part 413 of the HC1 410 may be connected to the fourth contact point 483 using a seventh via 472, and the fourth contact point 483 may be connected to the second contact point 481 using an eighth via 473. The third part 423 of the HC2 420 may be connected to the first part 421. For example, a sixth contact point 485 separate from the second part 422 of the HC2 420 may be formed in the second layer 492. A seventh contact point 486 that extends from the third part 423 of the HC2 420 may be connected to the sixth contact point 485 using a nineth via 474, and the sixth contact point 485 may be connected to the third contact point 482 using a tenth via 475. According to an embodiment of the disclosure, at least a part of the second part 412 of the HC1 410 may overlap the third part 413 of the HC1 410 when viewed in the z-axis direction. According to another embodiment, at least a part of the second part 421 of the HC2 420 may overlap the third part 423 of the HC2 420 when viewed in the z-axis direction.

Referring to FIG. 4D, when an RF signal is input to one of the first port 221 and the third port 223, an RF signal of approximately 3 GHz or higher may be output to the other port via the HPF 220b without any loss. An RF signal of approximately 3 GHz or lower may not substantially pass through the HPF 220b. For example, a cutoff frequency of the HPF 220b may be 3 GHz and a cutoff frequency band may be approximately 3 GHz or lower. According to an embodiment of the disclosure, a cutoff frequency may be changed when capacitance of a capacitor (e.g., the HC1 410, the HC2 420, the HC3 430) and/or inductance of the HL1 440 is changed.

Figure 5A:
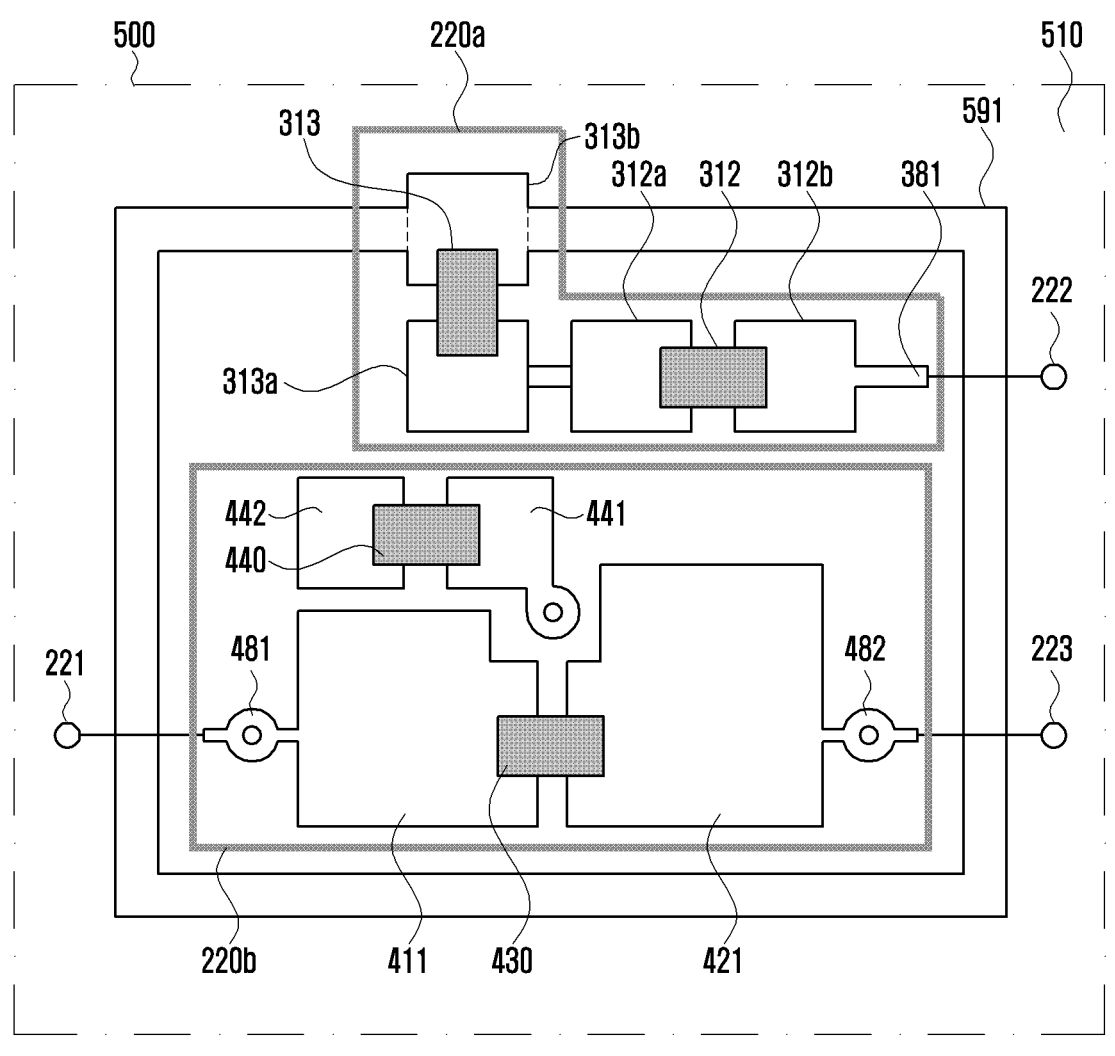
FIG. 5A is a diagram illustrating the surface of a PCB including a diplexer according to an embodiment of the disclosure.
Figure 5A:
Figure 5B:
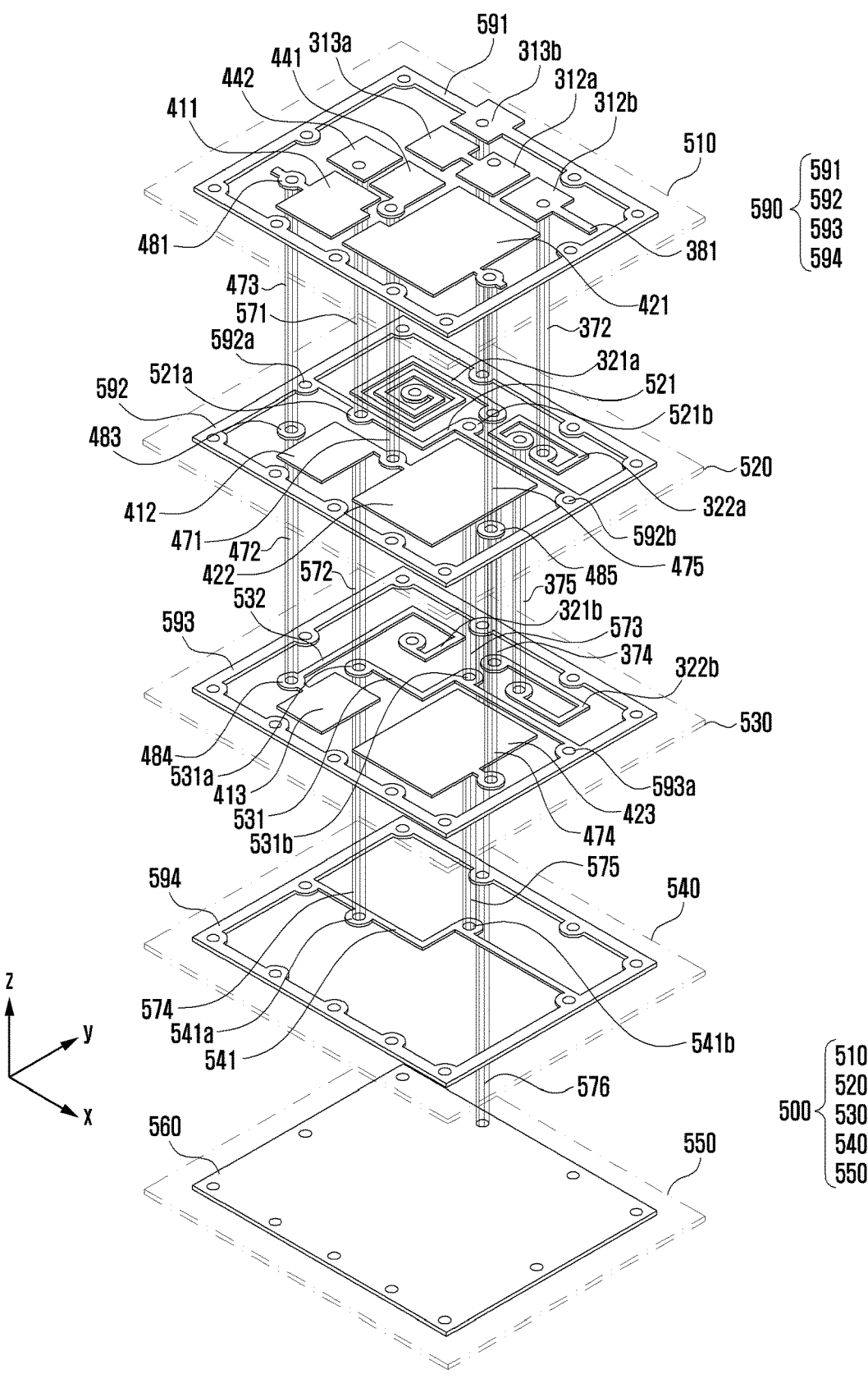
FIG. 5B is a diagram illustrating a layer structure of a diplexer in a PCB according to an embodiment of the disclosure.
Figure 5C:
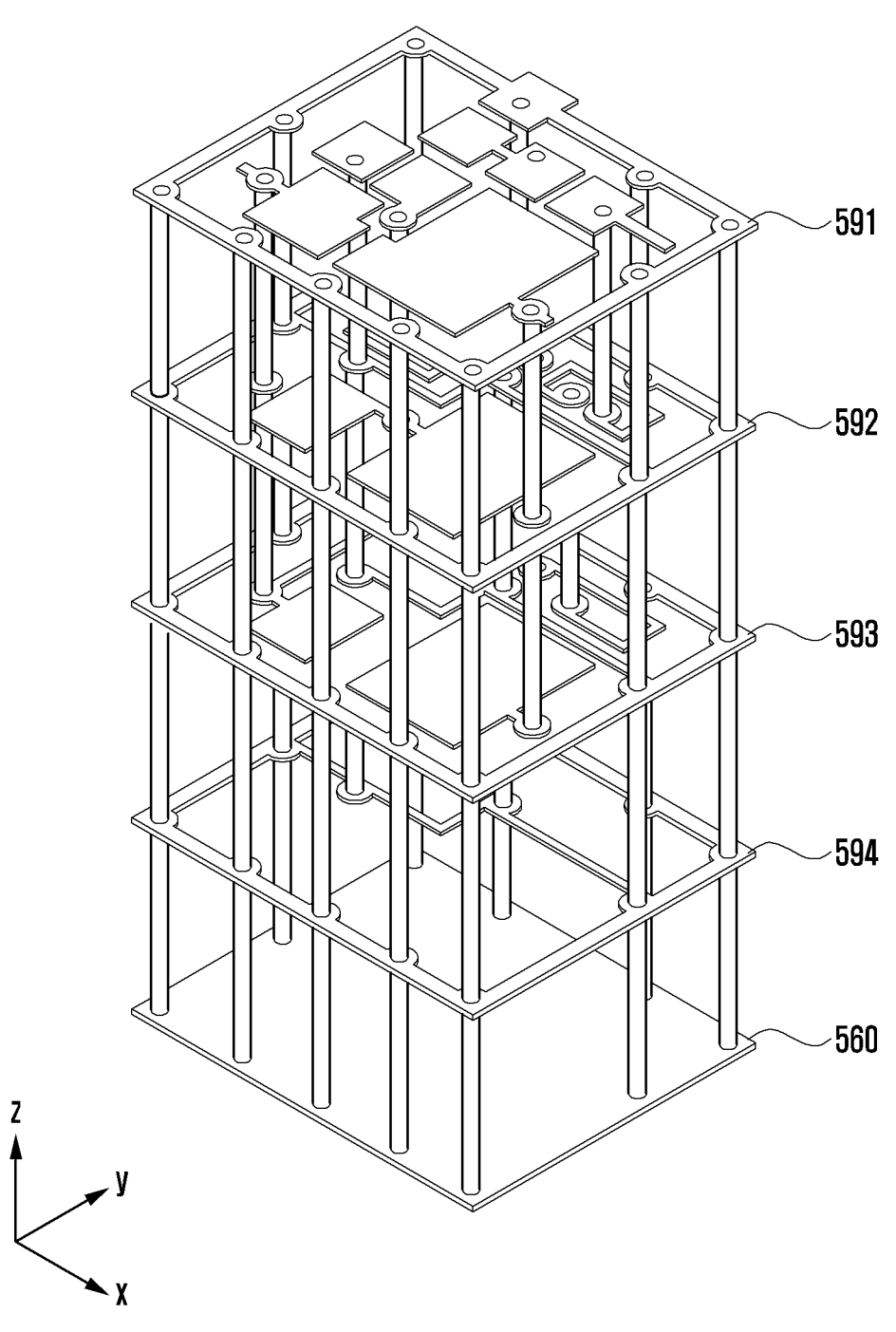
FIG. 5C is a diagram illustrating a layer structure of a ground in a PCB, according to an embodiment according to an embodiment of the disclosure.

FIG. 5A is a diagram illustrating the surface of a PCB 500 including the diplexer 220 according to an embodiment of the disclosure, FIG. 5B is a diagram illustrating a layer structure of the diplexer 220 in the PCB 500 according to an embodiment of the disclosure, and FIG. 5C is a diagram illustrating a layer structure of a ground in the PCB 500, according to an embodiment of the disclosure. The configuration that is structurally and/or functionally the same as the configuration that has been described in FIGS. 3A to 3D and 4A to 4D may be expressed using the like name and like reference numerals without a detailed description thereof, or may be briefly described.

Referring to FIG. 5A, the PCB 500 may include the diplexer 220 including the LPF 220a and the HPF 220b. The first port 221, the second port 222, and the third port 223 may be formed in a first layer 510 of the PCB 500. The first port 221 may be connected to the second contact point 481 (e.g., one end (I) of the HC1 410 in FIG. 4A) in the HPF 220b. The second port 222 may be connected to the first contact point 381 (e.g., the other end (D) of the LL2 322 in FIG. 3A) in the LPF 220a. The third port 223 may be connected to the third contact point 482 (e.g., the other end (L) of the HC2 420 in FIG. 4A) in the HPF 220b. According to an embodiment of the disclosure, the LC2 312, the LC3 313, the HC3 430, and/or the HL1 440 may be lumped elements disposed in the first layer 510. A lumped element may be selectively disposed on the PCB 500. For example, in the case of designing the diplexer 220, a lumped element having a value that accords with a filtering performance of the diplexer 220 may be selected.

Although not illustrated in FIG. 5A, the LL1 321 and the LL2 322 may be formed in a pattern on the PCB 500. As shown in parts 411 and 421 thereof in FIG. 5A, the HC1 410 and the HC2 420 may be formed in a pattern on the PCB 500. A ground connected to the (2-2)$^{th}$ pad 313b and the second pad 442 may be formed on the PCB 500. For example, a first ground pattern 591 may be formed in the first layer 510 in the form (e.g., a rectangular shape) of enclosing at least a part of the LPF 220a or the HPF 220b. As illustrated in FIG. 5A, the (2-2)$^{th}$ pad 313b may be formed as a part of the first ground pattern 591. Although not illustrated in FIG. 5A, the second pad 442 may be connected to the first ground pattern 591 via a conductive pattern (e.g., a wiring, a via) formed below the first layer 510 of the PCB 500. Although the first ground pattern 591 is formed in the first layer 510 in FIG. 5A, the first ground pattern 591 may be formed in another layer of the PCB 500.

Referring to FIG. 5B, the PCB 500 may further include a second layer 520, a third layer 530, a fourth layer 540, and/or a fifth layer 550, in addition to the first layer 510. A ground 590 may further include a second ground pattern 592 formed in the second layer 520, a third ground pattern 593 formed in the third layer 530, and/or a fourth ground pattern 594 formed in the fourth layer 540, in addition to the first ground pattern 591.

The first part 321a of the LL1 321, the first part 322a of the LL2 322, the second part 412 of the HC1 410, and the second part 422 of the HC2 420 may be formed in the second layer 520. The second ground pattern 592 may be disposed to enclose the parts 321a, 322a, 412, and 422. The second ground pattern 592 may be aligned with the first ground pattern 591, and may have substantially the same shape (e.g., a rectangular shape) as that of the first ground pattern 591. For example, the second ground pattern 592 may overlap the first ground pattern 591 when viewed in the z-axis direction.

A first wiring 521 that extends from a point 592a of a first side of the second ground pattern 592 to a point 592b of a second side that is parallel to the first side may be additionally formed in the second layer 520.

The second pad 442 may be connected to one point (an eighth contact point) 521a of the first wiring 521 using an 11$^{th}$ via 571. The second pad 442 may be connected to the second ground pattern 592 using an 11$^{th}$ via 571 and the eighth contact point 521a formed in the first wiring 521.

The second part 321b of the LL1 321, the second part 322b of the LL2 322, the third part 413 of the HC1 410, and/or the third part 423 of the HC2 420 may be formed in the third layer 530. The third ground pattern 593 may enclose the parts 321b, 322b, 413, and 423. The third ground pattern 593 may be aligned with the second ground pattern 592, and may have substantially the same shape (e.g., a rectangular shape) as that of the second ground pattern 592. For example, at least a part of the third ground pattern 593 may overlap the second ground pattern 592 when viewed in the z-axis direction.

A second wiring 531 that extends from a point 593a in any one side of the third ground pattern 593 (e.g., a side that is aligned with the second side of the second ground pattern 592) may be additionally formed in the third layer 530.

The eighth contact point 521a may be connected to a nineth contact point 531a of the second wiring 531 formed in third layer 530 using a 12$^{th}$ via 572. The tenth contact point 521b of the first wiring 521 may be connected to an 11$^{th}$ contact point 531b of the second wiring 531 using a 13$^{th}$ via 573. For example, the second pad 442 formed in the first layer 510 may also be connected to the third ground pattern 593 using the second wiring 531 and the 13$^{th}$ via 573.

A third wiring 532 that connects the second part 321b of the LL1 321 to a fifth contact point 484 may be additionally formed in the third layer 530. Accordingly, the LPF 220a may be connected to the first port 221 via the fifth contact point 484.

The fourth ground pattern 594 formed in the fourth layer 540 may be aligned with the third ground pattern 593, and may have substantially the same shape (e.g., a rectangular shape). For example, at least a part of the third ground pattern 593 may overlap the fourth ground pattern 594 when viewed in the z-axis direction. A fourth wiring 541 that is aligned with the first wiring 521 and that has the same shape may be additionally formed in the fourth layer 540. For example, at least a part of the first wiring 521 may overlap the fourth wiring 541 when viewed in the z-axis direction.

The ninth contact point 531*a* may be connected to a 12$^{th}$ contact point 541*a* of the fourth wiring 541 using a 14$^{th}$ via 574. The 11$^{th}$ contact point 531*b* may be connected to a 13$^{th}$ contact point 541*b* of the fourth wiring 541 using a 15$^{th}$ via 575. The second pad 442 formed in the first layer 510 may also be connected to the fourth ground pattern 594 using the fourth wiring 541.

A shielding sheet 560 may be formed in the fifth layer 550. The shielding sheet 560 may be formed as a single metallic plate, and may overlap the ground 590 when facing the PCB 500 in the z-axis direction. The shielding sheet 560 may be used for separating the diplexer 220 from an external electronic component. For example, the shielding sheet 560 may decrease an effect of an RF signal, which is transmitted or received in the diplexer 220, on an external electronic component located below the fifth layer 550 (e.g., in the −z-axis direction). The shielding sheet 560 may be connected to the fourth ground pattern 594 using a 16$^{th}$ via 576, and may act as a ground.

The ground 590 may be embodied to have a caging structure in order to increase the degree of isolation from external electronic components around the diplexer 220 or from other conductive parts in the PCB 500.

Referring to FIG. 5C, a plurality of vias that electrically connect the ground patterns 591, 592, 593, and 594 may be formed along the edges of the ground patterns 591, 592, 593, and 594.

According to an embodiment of the disclosure, the PCB 500 may further include one or more layers. For example, another diplexer, another conductive line, or other components, configured in substantially the same pattern as that of the above-described diplexer 220, may be disposed below the fifth layer 550 (e.g., in the −z-axis direction).

Figure 6A:
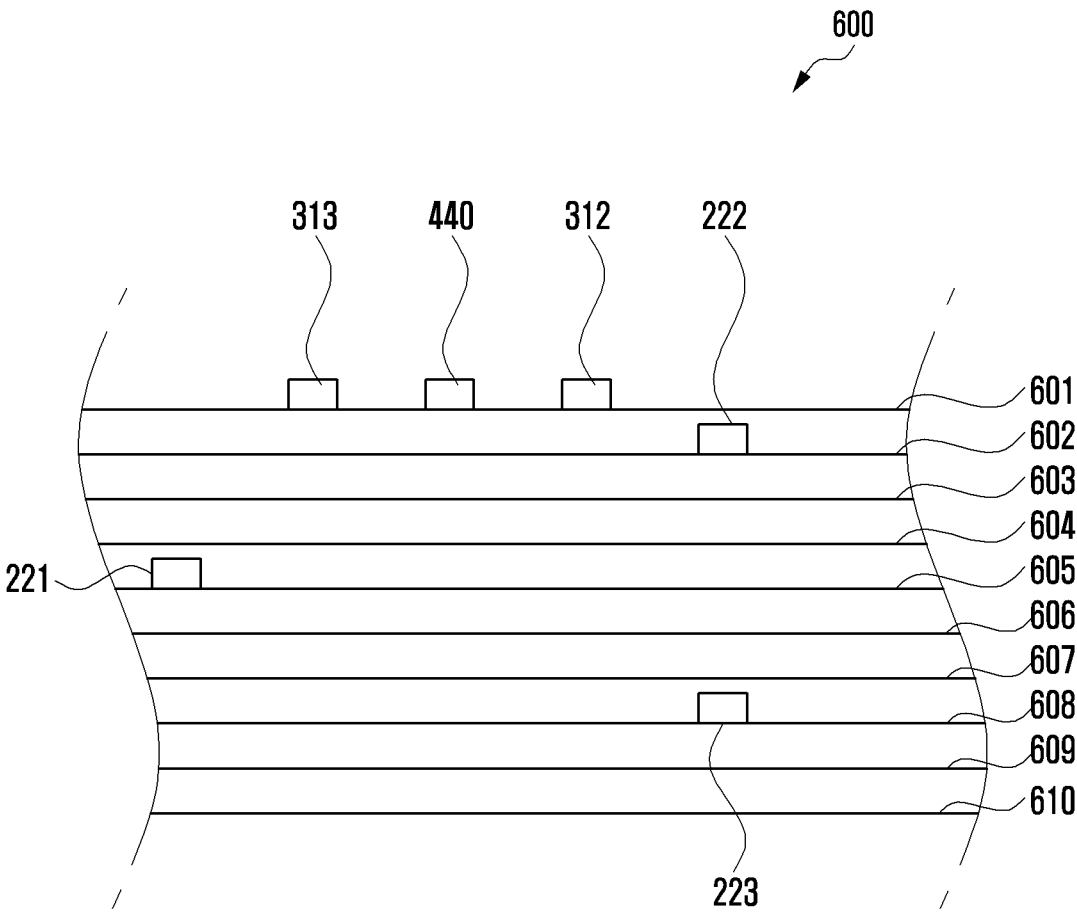
FIG. 6A is a diagram illustrating a sectional view of a PCB including a diplexer according to an embodiment of the disclosure.
Figure 6B:
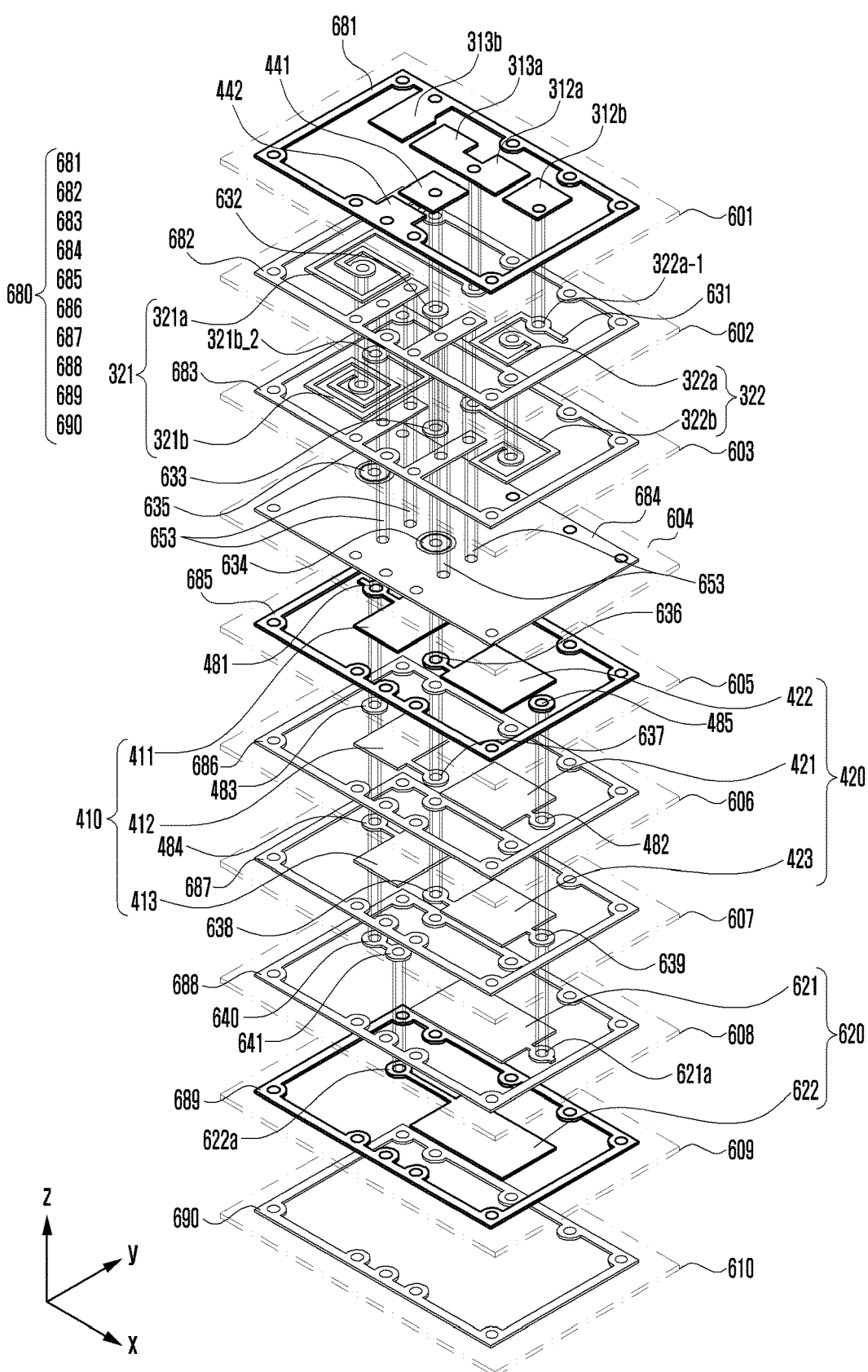
FIG. 6B is a diagram illustrating a layer structure of a diplexer in a PCB according to an embodiment of the disclosure.

FIG. 6A is a diagram illustrating a sectional view of a PCB 600 including the diplexer 220 according to an embodiment of the disclosure, and FIG. 6B is a diagram illustrating a layer structure of the diplexer 220 in the PCB 600 according to an embodiment of the disclosure. The configuration that is structurally and/or functionally the same as the configuration that has been described in FIGS. 3A to 3D and 4A to 4D may be expressed using the like name and like reference numerals without a detailed description thereof, or may be briefly described.

Referring to FIG. 6A, the PCB 600 may include a first layer 601, a second layer 602, a third layer 603, a fourth layer 604, a fifth layer 605, a sixth layer 606, a seventh layer 607, an eighth layer 608, a ninth layer 609, and/or a tenth layer 610. A first port 221, a second port 222, and a third port 223 may be formed in the fifth layer 605, the second layer 602, and the eighth layer 608, respectively. According to an embodiment of the disclosure, the LC2 312, the LC3 313, and/or the HL1 440 may be lumped elements and may be disposed in the first layer 510.

Referring to FIG. 6B, other elements (the LL1 321, the LL2 322, the HC1 410, the HC2 420, the HC3 620) of the diplexer 220 may be formed in a pattern on the PCB 600. A ground 680 that is connected to the (2-2)$^{th}$ pad 313*b* and the second pad 442 may include a plurality of ground patterns 681, 682, 683, 684, 685, 686, 687, 688, 689, and 690 formed in respective layers of the PCB 600.

The (1-1)$^{th}$ pad 312*a*, the (1-2)$^{th}$ pad 312*b*, the (2-1)$^{th}$ pad 313*a*, the (2-2)$^{th}$ pad 313*b*, the first pad 441, and/or the second pad 442 may be formed in the first layer 601. The first ground pattern 681 may be provided in the form (e.g., a rectangular shape) that encloses at least a part of the pads, and may be formed in the first layer 601. As illustrated in FIG. 6B, the (2-2)$^{th}$ pad 313*b* and the second pad 442 may be formed as a part of the first ground pattern 681.

The first part 321*a* of the LL1 321 and the first part 322*a* of the LL2 322 may be formed in the second layer 602. The second ground pattern 682 may be disposed to enclose the parts 321*a* and 322*a*. For example, the second ground pattern 682 may at least partially overlap the first ground pattern 681 when it is viewed in the +z-axis direction, and may have substantially the same shape (e.g., a rectangular shape) as that of the first ground pattern 681.

A 14$^{th}$ contact point 631 (e.g., the other end (D) of the LL2 322 in FIG. 3A) that extends from one end 322*a*_1 of the first part 322*a* of the LL2 322 may be connected to the second port 222 via a wiring.

A 15$^{th}$ contact point 632 may be additionally formed in the second layer 602, and the 15$^{th}$ contact point 632 may be electrically connected to the first pad 441 using a via.

The second part 321*b* of the LL1 321 and the second part 322*b* of the LL2 322 may be formed in the third layer 603. The third ground pattern 683 may be formed to enclose the parts 321*b* and 322*b*. For example, the third ground pattern 683 may at least partially overlap the second ground pattern 682 when viewed in the +z-axis direction, and may have substantially the same shape (e.g., a rectangular shape) as that of the second ground pattern 682.

A 16$^{th}$ contact point 633 may be additionally formed in the third layer 603, and the 16$^{th}$ contact point 633 may be connected to the first pad 441 using the 15$^{th}$ contact point 632 and a via.

The fourth ground pattern 684 formed in the fourth layer 604 may be connected to the third ground pattern 683 using one or more 19$^{th}$ vias 653. The fourth ground pattern 684 may be embodied as a single metallic plate, and may be used as a shielding sheet to separate an upper layer (e.g., in the +z-axis direction) and a lower layer (e.g., in the −z-axis direction) based on the fourth layer 604. The fourth layer 604 may be the ground layer of the PCB 600.

A 17$^{th}$ contact point 634 and/or an 18$^{th}$ contact point 635 separate from the fourth ground pattern 684 may be additionally formed in the fourth layer 604. The 17$^{th}$ contact point 634 may be electrically connected to the first pad 441 via the 15$^{th}$ contact point 632, the 16$^{th}$ contact point 633, and the via. The 18$^{th}$ contact point 635 may be electrically connected to the other end 321*b*_2 of the second part 321*b* of the LL1 321 using a via.

The second contact point 481, the first part 411 of the HC1 410, the second part 422 of the HC2 420, and the sixth contact point 484 may be formed in the fifth layer 605. The fifth ground pattern 685 may be formed to enclose the parts 411 and 422. For example, the fifth ground pattern 685 may at least partially overlap the third ground pattern 683 when viewed in the +z-axis direction, and may have substantially the same shape (e.g., a rectangular shape) as that of the third ground pattern 683.

The second contact point 481 (e.g., the one end (I) of the HC1 410 in FIG. 4A) that extends from the first part 411 of the HC1 410 may be connected to the first port 221 formed in the fifth layer 605 via a wiring. For example, one end of the HC1 410 may be connected to the first port 221 via the second contact point 481. The second contact point 481 may be connected to the 18$^{th}$ contact point 635 using a via. For example, one end of the LL1 321 may be connected to the first port 221 via the 18$^{th}$ contact point 635.

A 19$^{th}$ contact point 636 that extends from the second part 422 of the HC2 420 may be connected to the 17$^{th}$ contact point 634 using a via. For example, the second part 422 of the HC2 420 may be connected to the first pad 441 via the 19$^{th}$ contact point 636.

The third contact point 482, the fourth contact point 483, the second part 412 of the HC1 410, and/or the first part 421 of the HC2 420 may be formed in the sixth layer 606. The sixth ground pattern 686 may be formed to enclose at least a part of the parts 412 and 421. For example, the sixth ground pattern 686 may at least partially overlap the fifth ground pattern 685 when viewed in the +z-axis direction, and may have substantially the same shape (e.g., a rectangular shape) as that of the fifth ground pattern 685. The third contact point 482 (e.g., the other end (L) of the HC2 420 in FIG. 4A) that extends from the first part 421 of the HC2 420 may be connected to the third port 223 via a wiring. For example, the other end (L) of the HC2 420 may be electrically connected to the third port 223.

A 20$^{th}$ contact point 637 that extends from the second part 412 of the HC1 410 may be connected to the 19$^{th}$ contact point 636 using a via. For example, the second part 412 of the HC1 410 may be electrically connected to the first pad 441 and the second part 422 of the HC2 420 using the 20$^{th}$ contact point 637.

The third part 413 of the HC1 410, the third part 423 of the HC2 420, and the fifth contact point 484 may be formed in the seventh layer 607. The seventh ground pattern 687 may be formed to enclose at least a part of the parts 413 and 423. For example, the seventh ground pattern 687 may at least partially overlap the sixth ground pattern 686 when viewed in the +z-axis direction, and may have substantially the same shape (e.g., a rectangular shape) as that of the sixth ground pattern 686.

A 21$^{st}$ contact point 638 that extends from the third part 423 of the HC2 420 may be additionally formed in the seventh layer 570. The 21$^{st}$ contact point 638 may be connected to the 20$^{th}$ contact point 637 using a via. For example, the third part 423 of the HC2 420 may be connected to the first pad 441 via the 21$^{st}$ contact point 638.

A 22$^{nd}$ contact point 639 separate from the third part 423 of the HC2 420 may be additionally formed in the seventh layer 570. The 22$^{nd}$ contact point 639 may be connected to the third contact point 482 using a via.

A first part 621 of the HC3 620 may be formed in the eighth layer 608. The eighth ground pattern 688 may be formed to enclose the first part 621 of the HC3 620. For example, the eighth ground pattern 688 may at least partially overlap the seventh ground pattern 687 when viewed in the +z-axis direction, and may have substantially the same shape (e.g., a rectangular shape) as that of the seventh ground pattern 687.

A 23$^{rd}$ contact point 621a that extends from the first part 621 of the HC3 620 may be connected to the 22$^{nd}$ contact point 639 using a via. For example, the first part 621 of the HC3 620 may be connected to the third port 223 via the 23$^{rd}$ contact point 621a.

A 24$^{th}$ contact point 640 and a 25$^{th}$ contact point 641 connected thereto may be additionally formed in the eighth layer 608. The 24$^{th}$ contact point 640 may be connected to the fifth contact point 484 using a via.

A second part 622 of the HC3 620 may be formed in the ninth layer 609. The ninth ground pattern 689 may be formed to enclose the second part 622 of the HC3 620. For example, the ninth ground pattern 689 may at least partially overlap the eighth ground pattern 688 when viewed in the +z-axis direction, and may have substantially the same shape (e.g., a rectangular shape) as that of the eighth ground pattern 688.

A 26$^{th}$ contact point 622a that extends from the second part 622 of the HC3 620 may be connected to the 25$^{th}$ contact point 641 using a via. For example, the second part 622 of the HC3 620 may be connected to the first port 221 via the 26$^{th}$ contact point 622a.

The tenth ground pattern 690 formed in the tenth layer 610 may at least partially overlap the ninth ground pattern 689 when viewed in the +z-axis direction, and may have the same shape (e.g., a rectangular shape).

The ground 680 may be embodied to have a caging structure using a plurality of vias as shown in FIG. 5C in order to increase the degree of isolation from an external electronic component around the diplexer 220. For example, first to tenth ground patterns 681 to 690 may be electrically connected using a plurality of vias. As another example, the first to tenth ground patterns 681 to 690 may be electrically connected to a ground included in the PCB 600.

According to an embodiment of the disclosure, the first to third layers 681 to 683 may form an LPF (e.g., the LPF 220a of FIG. 3A). According to another embodiment, the fifth to ninth layers 685 to 689 may form a HPF (e.g., the HPF 220b of FIG. 4A).

The diplexer layer structure of FIGS. 6A and 6B may include a larger number of layers used for a PCB. Accordingly, the diplexer layer structure of FIGS. 6A and 6B may be thicker than the diplexer layer structure of FIGS. 5A to 5C, but a used area (XY area) may be conserved. Therefore, the structure of FIGS. 5A to 5C or the structure of FIGS. 6A and 6B may be selectively used according to the structure of an internal space of a set (e.g., a smartphone).

An electronic device according to various embodiments of the disclosure may include an antenna, a wireless communication circuit, and a diplexer (e.g., the diplexer 220) connected to the antenna and the wireless communication circuit. The diplexer may include a first port connected to the antenna; a second port connected to the wireless communication circuit; a third port connected to the wireless communication circuit; a low pass filter (LPF) (e.g., LPF 220a) configured to filter a signal received from one of the first port and the second port so as to obtain an RF signal of a low-frequency band and to output same to the other port between the first port and the second port; and a high pass filter (HPF) (e.g., HPF 220b) configured to filter a signal received from one of the first port and the third port so as to obtain an RF signal of a high-frequency band and to output same to the other port between the first port and the third port. The LPF may include a capacitor disposed on a surface of a printed circuit board (PCB) and an inductor formed in a pattern on the PCB. The HPF may include an inductor disposed on the surface of the PCB and a capacitor formed in a pattern on the PCB.

The LPF may include an LPF capacitor (LC)2, an LC3, an LPF inductor (LL)1, and an LL2, and the HPF may include a HPF capacitor (HC)1, an HC2, an HC3, and an HPF inductor (HL)1. One end of the LL1 may be connected to the first port and the other end of the LL1 is connected to one end of the LL2, and the other end of the LL2 is connected to the second port. One end of the LC2 is connected to one end of the LL2 and the other end of the LC2 is connected to the other end of the LL2. One end of the LC3 may be connected to the other end of the LL1 and one end of the LL2, and the other end of the LC3 is connected to a ground formed in the PCB. One end of the HC1 is connected to the first port and the other end of the HC1 is connected to one end of the HC2. The other end of the HC2 may be connected to the third port 223. One end of the HC3 may be connected to one end of the HC1 and the other end of the HC3 may be connected to the other end of the HC2. One end of the HL1 may be connected to the other end of the HC1 and one end of the HC2. The other end of the HL1 may be connected to a ground formed in the PCB. The LC2, the LC3, and the HL1 may be lumped elements disposed on the PCB surface, and the LL1, the LL2, the HC1, and the HC2 may be formed in a pattern on the PCB. The HC3 may be a lumped element disposed on the PCB surface or may be formed in a pattern on the PCB.

The HC3 may be a lumped element disposed on the surface of the PCB, and the PCB may include a first layer that includes the PCB surface, and in which pads for disposing a lumped element, a first part of the HC1, and a first part of the HC2 are formed; a second layer that is disposed under the first layer, and in which a first part of the LL1, a first part of the LL2, a second part of the HC1, and a second part of the HC2 are formed; and a third layer that is disposed under the second layer, and in which a second part of the LL1, a second part of the LL2, a third part of the HC1, and a third part of the HC2 are formed.

The PCB may further include a shielding sheet disposed under the third layer. The ground may include a ground pattern formed in each layer of the PCB. The ground may include a first ground pattern provided in the first layer in the form of enclosing the pads, the first part of the HC1, and the first part of the HC2; a second ground pattern provided in the second layer in the form of enclosing the first part of the LL1, the first part of the LL2, the second part of the HC1, and the second part of the HC2; and a third ground pattern provided in the third layer in the form of enclosing the second part of the LL1, the second part of the LL2, the third part of the HC1, and the third part of the HC2. A pad to which the other end of the LC3 is attached among the pads may be configured as a part of the first ground pattern. The ground patterns may be aligned and a plurality of vias that connect the ground patterns may be formed along edges of the ground patterns.

The HC3 may be formed in a pattern on the PCB, and the PCB may include a first layer that includes the PCB surface, and in which pads for disposing a lumped element are formed; a second layer located under the first layer, and in which the first part of the LL1 and the first part of the LL2 are formed; a third layer located under the second layer, and in which the second part of the LL1 and the second part of the LL2 are formed; a fourth layer located under the third layer and including a shielding sheet; a fifth layer located under the fourth layer, and in which the first part of the HC1 and the first part of the HC2 are formed; a sixth layer located under the fifth layer, and in which the second part of the HC1 and the second part of the HC2 are formed; a seventh layer located under the sixth layer, and in which the third part of the HC1 and the third part of the HC2 are formed; an eighth layer located under the seventh layer, and in which the first part of the HC3 is formed; and a ninth layer located under the eighth layer, and in which the second part of the HC3 is formed.

The ground may include a ground pattern formed in each layer of the PCB. The ground may include a first ground pattern provided in the first layer in the form of enclosing the pads; a second ground pattern provided in the second layer in the form of enclosing the first part of the LL1 and the first part of the LL2; a third ground pattern provided in the third layer in the form of enclosing the second part of the LL1 and the second part of the LL2; a fourth ground pattern including the shielding sheet, and formed in the fourth layer; a fifth ground pattern provided in the fifth layer in the form of enclosing the first part of the HC1 and the first part of the HC2; a sixth ground pattern provided in the sixth layer in the form of enclosing the second part of the HC1 and the second part of the HC2; a seventh ground pattern provided in the seventh layer in the form of enclosing the third part of the HC1 and the third part of the HC2; an eighth ground pattern provided in the eighth layer in the form of enclosing the first part of the HC3; and a ninth ground pattern provided in the ninth layer in the form of enclosing the second part of the HC3. A pad to which the other end of the LC3 is attached among the pads may be configured as a part of the first ground pattern. A pad to which the other end of the HL1 is attached among the pads may be configured as another part of the first ground pattern. The ground patterns may be aligned and a plurality of vias that connect the ground patterns may be formed along edges of the ground patterns.

The first port, the second port, and the third port may be formed in a surface of the PCB. A ground pattern that is connected to the LPF and the HPF may be formed in the PCB in the form of enclosing the LPF and the HPF, and the first port, the second port, and the third port may be formed in an outer boundary of the ground pattern.

The low-frequency band may be less than or equal to approximately 3 GHz, and the high-frequency band may be greater than or equal to approximately 3 GHz.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
an antenna;
a wireless communication circuit; and
a diplexer connected to the antenna and the wireless communication circuit,
wherein the diplexer comprises:
a first port connected to the antenna,
a second port connected to the wireless communication circuit,
a third port connected to the wireless communication circuit,
a low pass filter (LPF) configured to filter a signal received from one of the first port and the second port so as to obtain an RF signal of a low-frequency band and to output the RF signal of the low-frequency band to the other port between the first port and the second port,
a high pass filter (HPF) configured to filter a signal received from one of the first port and the third port so as to obtain an RF signal of a high-frequency band and to output the RF signal of the high-frequency band to the other port between the first port and the third port, and
a ground structure connected to the LPF and the HPF,
wherein the LPF comprises a capacitor disposed on an outer surface of a printed circuit board (PCB) and an inductor formed in a pattern within the PCB,
wherein the HPF comprises an inductor disposed on the surface of the PCB and a capacitor formed in a pattern on the PCB,
wherein the PCB comprises a plurality of layers,
wherein the ground structure surrounds the LPF and the HPF along a direction in which the plurality of layers is stacked, and
wherein the first port, the second port, and the third port are disposed on the outer surface of the PCB.

2. The electronic device of claim 1, wherein the LPF comprises an LPF capacitor (LC)2, an LC3, an LPF inductor (LL)1, and an LL2, and the HPF comprises a HPF capacitor (HC)1, an HC2, an HC3, and an HPF inductor (HL)1, wherein one end of the LL1 is connected to the first port and the other end of the LL1 is connected to one end of the LL2, wherein the other end of the LL2 is connected to the second port and one end of the LC2 is connected to one end of the LL2 and the other end of the LC2 is connected to the other end of the LL2, wherein one end of the LC3 is connected to the other end of the LL1 and one end of the LL2, and the other end of the LC3 is connected to the ground structure, wherein one end of the HC1 is connected to the first port and the other end of the HC1 is connected to one end of the HC2, wherein the other end of the HC2 is connected to the third port, wherein one end of the HC3 is connected to one end of the HC1 and the other end of the HC3 is connected to the other end of the HC2, wherein one end of the HL1 is connected to the other end of the HC1 and one end of the HC2, wherein the other end of the HL1 is connected to the ground structure, wherein the LC2, the LC3, and the HL1 are lumped elements disposed on the surface of the PCB, wherein the LL1, the LL2, the HC1, and the HC2 are formed in a pattern on the PCB, and wherein the HC3 is a lumped element disposed on the surface of the PCB or is formed in a pattern on the PCB.

3. The electronic device of claim 2, wherein the HC3 is a lumped element disposed on the surface of the PCB, and wherein the PCB comprises:

a first layer that includes the surface of the PCB, and in which pads for disposing a lumped element, a first part of the HC1, and a first part of the HC2 are formed, a second layer that is disposed under the first layer, and in which a first part of the LL1, a first part of the LL2, a second part of the HC1, and a second part of the HC2 are formed, and a third layer that is disposed under the second layer, and in which a second part of the LL1, a second part of the LL2, a third part of the HC1, and a third part of the HC2 are formed.

4. The electronic device of claim 3, wherein the PCB further comprises a shielding sheet disposed under the third layer.

5. The electronic device of claim 3, wherein the ground structure comprises a plurality of ground patterns, the plurality of ground patterns comprising:

a first ground pattern provided in the first layer, the first ground pattern enclosing the pads, the first part of the HC1, and the first part of the HC2;

a second ground pattern provided in the second layer, the second ground pattern enclosing the first part of the LL1, the first part of the LL2, the second part of the HC1, and the second part of the HC2; and a third ground pattern provided in the third layer, the third ground pattern enclosing the second part of the LL1, the second part of the LL2, the third part of the HC1, and the third part of the HC2.

6. The electronic device of claim 5, wherein a pad to which the other end of the LC3 is attached among the pads is configured as a part of the first ground pattern.

7. The electronic device of claim 5, wherein the plurality of ground patterns are aligned and a plurality of vias that connect the plurality of ground patterns are formed along edges of the plurality of ground patterns.

8. The electronic device of claim 2, wherein the HC3 is formed in a pattern on the PCB, and wherein the PCB comprises:

a first layer that includes the surface of the PCB, and in which pads for disposing a lumped element are formed;

a second layer located under the first layer, and in which a first part of the LL1 and a first part of the LL2 are formed;

a third layer located under the second layer, and in which a second part of the LL1 and a second part of the LL2 are formed, formed;

a fourth layer located under the third layer and including a shielding sheet;

a fifth layer located under the fourth layer, and in which a first part of the HC1 and a first part of the HC2 are formed;

a sixth layer located under the fifth layer, and in which a second part of the HC1 and a second part of the HC2 are formed;

a seventh layer located under the sixth layer, and in which a third part of the HC1 and a third part of the HC2 are formed;

an eighth layer located under the seventh layer, and in which a first part of the HC3 is formed; and a ninth layer located under the eighth layer, and in which a second part of the HC3 is formed.

9. The electronic device of claim 8, wherein the ground structure comprises a plurality of ground patterns, the plurality of ground patterns comprising:

a first ground pattern provided in the first layer, the first ground pattern enclosing the pads;

a second ground pattern provided in the second layer, the second ground pattern enclosing the first part of the LL1 and the first part of the LL2;

a third ground pattern provided in the third layer, the third ground pattern enclosing the second part of the LL1 and the second part of the LL2;

a fourth ground pattern including the shielding sheet, the fourth ground pattern formed in the fourth layer;

a fifth ground pattern provided in the fifth layer, the fifth ground pattern enclosing the first part of the HC1 and the first part of the HC2;

a sixth ground pattern provided in the sixth layer, the sixth ground pattern enclosing the second part of the HC1 and the second part of the HC2;

a seventh ground pattern provided in the seventh layer, the seventh ground pattern enclosing the third part of the HC1 and the third part of the HC2;

an eighth ground pattern provided in the eighth layer, the eighth ground pattern enclosing the first part of the HC3; and a ninth ground pattern provided in the ninth layer, the ninth ground pattern enclosing the second part of the HC3.

10. The electronic device of claim 9, wherein a pad to which the other end of the LC3 is attached among the pads is configured as a part of the first ground pattern, and wherein a pad to which the other end of the HL1 is attached among the pads is configured as another part of the first ground pattern.

11. The electronic device of claim 9, wherein the plurality of ground patterns are aligned and a plurality of vias that connect the plurality of ground patterns are formed along edges of the plurality of ground patterns.

12. The electronic device of claim 1, wherein the first port, the second port, and the third port are formed in an outer boundary of the ground structure.

13. The electronic device of claim 1, wherein the low-frequency band is less than or equal to approximately 3 GHz, and the high-frequency band is greater than or equal to approximately 3 GHz.

14. The electronic device of claim 1, further comprising:
a first duplexer configured to:
filter a signal received from the wireless communication circuit to obtain an RF signal having a first transmission frequency band and to output same to the LPF, and
filter a signal received from the LPF to obtain an RF signal having a first reception frequency band and to output same to the wireless communication circuit; and a second duplexer configured to:
filter a signal received from the wireless communication circuit to obtain an RF signal having a second transmission frequency band and to output same to the HPF, and
filter a signal received from the HPF to obtain an RF signal having a second reception frequency band and to output same to the wireless communication circuit.

15. The electronic device of claim 14, further comprising:
a power amplifier configured to amplify power of a signal received from the wireless communication circuit and to output the amplified signal to the first duplexer or the second duplexer.

16. The electronic device of claim 3, wherein a portion of the first part of the LL1 overlaps a portion of the second part of the LL1 when the PCB is viewed in a z-axis direction.

17. The electronic device of claim 3, further comprising a conductive line extending from one end of the first part of the LL1 to the other end of the first part of the LL1.

18. The electronic device of claim 17, wherein the conductive line is formed as one of a coil or a curve.

* * * * *